(12) United States Patent
Yoon et al.

(10) Patent No.: US 8,253,896 B2
(45) Date of Patent: Aug. 28, 2012

(54) PHOTONIC SENSOR, METHOD OF MANUFACTURING SAME, COLOR FILTER SUBSTRATE HAVING SAME, AND DISPLAY DEVICE HAVING THE COLOR FILTER SUBSTRATE

(75) Inventors: Kap-Soo Yoon, Seoul (KR); Sung-Hoon Yang, Seoul (KR); Ki-Hun Jeong, Chungcheongnam-do (KR); Kyung-Sook Jeon, Gyeonggi-do (KR); Seung-Mi Seo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 144 days.

(21) Appl. No.: 12/898,250

(22) Filed: Oct. 5, 2010

(65) Prior Publication Data
US 2011/0090437 A1    Apr. 21, 2011

(30) Foreign Application Priority Data
Oct. 19, 2009    (KR) .................. 10-2009-0099188

(51) Int. Cl.
*G02F 1/1335*    (2006.01)

(52) U.S. Cl. .................... 349/108; 349/106; 349/107

(58) Field of Classification Search ............... 349/48
See application file for complete search history.

(56) References Cited

U.S. PATENT DOCUMENTS

| | | |
|---|---|---|
| 2007/0229424 A1 | 10/2007 | Hayashi et al. |
| 2008/0246905 A1 | 10/2008 | Chen et al. |
| 2009/0057564 A1 | 3/2009 | Miyayama et al. |

FOREIGN PATENT DOCUMENTS

| | | |
|---|---|---|
| JP | 2000-329928 | 11/2000 |
| JP | 2002-083946 | 3/2002 |
| JP | 2004-0235579 | 8/2004 |
| JP | 2006-343229 | 12/2006 |
| JP | 2008-182247 | 8/2008 |
| KR | 1020070003179 A | 1/2007 |
| KR | 1020080028270 A | 3/2008 |
| KR | 1020080062932 A | 7/2008 |
| KR | 1020080095626 A | 10/2008 |
| KR | 1020080107221 A | 12/2008 |

*Primary Examiner* — Phu Vu
(74) *Attorney, Agent, or Firm* — Innovation Counsel LLP

(57) ABSTRACT

A photonic sensor includes a first electrode layer, a second electrode layer, a third electrode layer, a first photon absorption layer, a second photon absorption layer, a third photon absorption layer and a charge blocking layer. The first photon absorption layer includes a dispersion of first nanoparticles, and is configured to transduce a first colored light into corresponding electric charge. The second photon absorption layer includes a dispersion of second nanoparticles, and is configured to transduce a second colored light into corresponding electric charge according to light intensity. The third photon absorption layer includes a dispersion of third nanoparticles, and is configured to transduce a third colored light into corresponding electric charge according to light intensity. The charge blocking layer is formed between the first and second photon absorption layers to block flow of electric charge between the first and second photon absorption layers.

19 Claims, 16 Drawing Sheets

PHOTONIC SENSOR, METHOD OF MANUFACTURING SAME, COLOR FILTER SUBSTRATE HAVING SAME, AND DISPLAY DEVICE HAVING THE COLOR FILTER SUBSTRATE

PRIORITY STATEMENT

This application claims priority under 35 U.S.C. §119 to Korean Patent Application No. 2009-0099188, filed on Oct. 19, 2009 in the Korean Intellectual Property Office (KIPO), the contents of which application are herein incorporated by reference in their entirety.

BACKGROUND

1. Field of Disclosure

The present disclosure of invention relates to a photonic sensor such as one that can be monolithically integrated into a repeated pixel unit of a display device (e.g., an LCD device). The present disclosure also relates to a method of manufacturing the sensor, to a color filter substrate having the same, and to a display device having the color filter substrate with sensor included. More particularly, example embodiments relate to a monolithically integrated photonic sensor that is structured for reducing cost and power consumption of the display device, to a method of manufacturing the same, to a color filter substrate having the same, and to a display device having the color filter substrate.

2. Description of Related Technology

Among flat panel display devices, the liquid crystal display (LCD) device has advantages such as ability to make the display relatively thin, of light weight, of low power consumption etc. Thus the LCD device is widely used as a display device such as for a TV or computer monitor, a laptop computer display, a cellular phone display, etc. The LCD device includes an LCD panel for displaying an image by modulating a light transmittance characteristic (e.g., polarization attribute) of liquid crystal molecules, and typically by using a backlight unit disposed under the LCD panel to provide the LCD panel with backlighting light.

The LCD panel typically comprises two spaced apart substrates, namely, a switching elements array substrate and an opposite substrate with a liquid crystal material layer being interposed between the array substrate and the opposite substrate. The array substrate typically includes a plurality of crossing signal lines, a plurality of switching elements such as thin-film transistors and a plurality of corresponding pixel electrodes whose charge states are controlled by data signals passed through respective ones of the signal lines and respective ones of the switching elements. The opposite substrate faces the array substrate, and typically includes a common electrode that provides a so-called common voltage in opposition to voltages stored on the pixel-electrodes of the switching elements array substrate.

The LCD panel may be provided with various integral functions such as that of a touch panel structured to determine and produce touch position data in response to an external touch. That is, the produced position data may be supplied to a data processing unit (e.g., CPU) of an intercoupled main system when the LCD panel is touched by an electronic pen or by a human finger and the data processing unit may then respond according to drive software driving that data processing unit.

Among the different kinds of integral position determining functions included in the LCD panel there may be an infrared ray detecting function provided to function as part of the touch panel functions. When the infrared ray (IR) function is included, the touch panel will include an infrared ray generation device (e.g., IR pen) and an IR position detecting device. The infrared ray generation device is structured to generate infrared rays that are to be irradiated to the LCD panel while being influenced by the user. The detecting device detects the infrared rays generated from the infrared ray generation device. In one embodiment of the infrared ray method, when a finger or any other object touches a portion of the LCD panel, the infrared rays irradiated to the touched portion are intercepted (blocked by the pointing finger), and the detecting device detects the location of the intercepted infrared rays (in other words, the edges of their shadows) to thereby sense the position of the touched portion of the screen.

For accurate position determination however, a large number of infrared ray generation devices and detecting devices are often necessary so that the point of touch may be more accurately determined. Thus, power consumption of the touch panel and its supporting infrastructure is increased and a cost for manufacturing the touch panel is increased as more IR sources are added and used.

SUMMARY

The present disclosure of invention provides a photonic sensor that is structured for reducing cost and power consumption for example when used with a visible light rays method of determining point of touch of a screen adjacent and touching object (as shall be described below) and/or when used with a visible light rays method of visualizing the screen adjacent object in, for example, the RGB gamut space.

The present disclosure of invention also provides a method of manufacturing the photonic sensor, a color filter substrate having the photonic sensor monolithically integrated therein, and a display device having the color filter substrate.

In accordance with one aspect of the present disclosure of invention, a monolithically integrated photonic sensor includes a first electrode layer, a second electrode layer, a third electrode layer, a first photon absorption layer, a second photon absorption layer, a third photon absorption layer and a semiconductive blocking layer. The first electrode layer may be formed on a light-passing substrate. The first electrode layer is configured to receive a supplied first voltage. The second electrode layer is configured to receive a supplied second voltage different from the first voltage (e.g., opposite in polarity). The third electrode layer is configured to receive a supplied third voltage which could be the same as the first voltage. The first photon absorption layer overlaps with and electrically connects to the first electrode layer so as to receive the first voltage. The first photon absorption layer includes first nanoparticles dispersed therein and is capable of sensing a first colored light. The second photon absorption layer overlaps with and electrically connects to the second electrode layer so as to receive the second voltage. The second photon absorption layer includes second nanoparticles dispersed therein and having an average per particle size different from an average size of the first nanoparticles. The second photon absorption layer is capable of discriminatingly sensing a second range of wavelengths of colored light. The third photon absorption layer overlaps with and electrically connects to the third electrode layer so as to receive the third voltage which could be the same as the first voltage. The third photon absorption layer includes third nanoparticles dispersed therein and having an average size different from the average sizes of the first nanoparticles and the second nanoparticles. The third photon absorption layer is capable of discriminatingly sensing a third range of wavelengths of colored light.

The semiconductive blocking layer is formed between the first photon absorption layer and the second photon absorption layer. The blocking layer acts to blocks a flow of free charges between the first photon absorption layer and the second photon absorption layer. In one embodiment, the dispersed nanoparticles are Si clusters in a $SiN_x$ host where the Si clusters may serve as quantum dots capable of converting incident photons into corresponding electron-hole pairs.

In one example embodiment, the first color light range may have a first peak wavelength. The second color light range may have a second peak wavelength different from the first peak wavelength, and the third color light range may have a respective third peak wavelength different from than the first and second peak-wise detectable wavelengths.

In one example embodiment, a band gap of the first photon absorption layer may be larger than a band gap of the second photon absorption layer, and the band gap of the second photon absorption layer may be larger than a band gap of the third photon absorption layer.

In one example embodiment, an average size (e.g., average diameter) of the first nanoparticles may be smaller than that of the second nanoparticles, and the average size of the second nanoparticles may be smaller than that of the third nanoparticles.

In one example embodiment, a band gap of the blocking layer may be larger than band gaps of the first photon absorption layer, the second photon absorption layer and the third photon absorption layer.

In one example embodiment, each of the first photon absorption layer, the second photon absorption layer and the third photon absorption layer may comprise a bulk host material such as a silicon nitride ($SiN_x$, where x can vary) in which nano-particles of a different material are embedded. Each of the first, second and the third nanoparticles may comprise a nucleated crystalline silicon nano-particle (silicon nano cluster) of average size and average particle-to-particle spacing distribution corresponding to its respective photon absorption layer.

In accordance with another aspect of the present disclosure, there is provided a method of manufacturing a photonic sensor. In the method, a first electrode layer is formed on a substrate. A first photon absorption layer is formed on the first electrode layer. The first photon absorption layer includes a first nanoparticle and senses a first color light. A blocking layer is formed on the first photon absorption layer. The blocking layer blocks a flow of charge. A second photon absorption layer is formed on the blocking layer. The second photon absorption layer includes a second nanoparticle having a size different from a size of the first nanoparticle. The second photon absorption layer senses a second color light. A second electrode layer is formed on the second photon absorption layer. A third photon absorption layer is formed on the second electrode layer. The third photon absorption layer includes a third nanoparticle having a size different from the sizes of the first nanoparticle and the second nanoparticle. The third photon absorption layer senses a third color light. A third electrode layer is formed on the third photon absorption layer.

In one example embodiment of the present invention, an average size of the first nanoparticles may be smaller than an average size of the second nanoparticles, and the size of the second nanoparticles may be smaller than an average size of the third nanoparticles.

In one example embodiment, each of the first photon absorption layer, the second photon absorption layer and the third photon absorption layer may comprise a silicon nitride host body. Each of the first nanoparticles, the second nanoparticles and the third nanoparticles may comprise silicon nano cluster particles. Thicknesses of the first through third photon absorption layers and sizes as well as dispersal patterns of the hosted nano-particles (e.g., Si nano clusters) may vary.

In accordance with still another aspect of the present disclosure, a color filter substrate includes a photonic sensor and a color filter pattern. The photonic sensor is formed on a substrate to sense a first range of light wavelengths (e.g., blue), a second range of light wavelengths (e.g., green) and a third range of light wavelengths (e.g., red). The photonic sensor includes a first electrode layer, a second electrode layer, a third electrode layer, a first photon absorption layer, a second photon absorption layer, a third photon absorption layer and a semiconductive blocking layer. The first electrode layer is formed on the color filter substrate. The first electrode layer receives a first voltage. The second electrode layer receives a second voltage different from the first voltage. The third electrode layer receives a third voltage which could be the same as the first voltage. The first photon absorption layer overlaps with the first electrode layer and receives the first voltage. The first photon absorption layer includes first nanoparticles dispersed therein (e.g., as quantum dots) and operates to sense a first colored range of light. The second photon absorption layer overlaps with the second electrode layer and receives the second voltage. The second photon absorption layer includes second nanoparticles having a size different from a size of the first nanoparticles. The second photon absorption layer senses a different second subspectrum of color light. The third photon absorption layer overlaps with the third electrode layer and receives the third voltage. The third photon absorption layer includes third nanoparticles having a size different from the sizes of the first nanoparticles and the second nanoparticles. The third photon absorption layer senses a different third spectral range of colored light. The blocking layer is formed between the first photon absorption layer and the second photon absorption layer. The blocking layer blocks a flow of free charge between the first photon absorption layer and the second photon absorption layer. The color filter pattern is formed on the substrate on which the photonic sensor is formed. The color filter pattern includes a plurality of color filters.

In one example embodiment, the color filter substrate may further includes a first voltage line structured to supply a first voltage to the sensors of the color filter substrate, a second voltage line structured to supply a different second voltage to the sensors of the color filter substrate, a first switching element, a second switching element, a third switching element, a first sensing gate line and a second sensing gate line. The first voltage line extends in a first direction, and is configured to apply the first voltage to the first electrode layer. The second voltage line is adjacent to the first voltage line. The second voltage line is configured to apply the second voltage to the second electrode layer and/or to the third electrode layer. The first switching element is electrically connected to the first voltage line and the first electrode layer. The second switching element is electrically connected to the second voltage line and the second electrode layer. The third switching element is electrically connected to the third voltage line and the third electrode layer. The first sensing gate line extends in a second direction different from the first direction. The first sensing gate line applies a first sensing gate signal to the first switching element and to the second switching element. The second sensing gate line is adjacent to the first sensing gate line. The second sensing gate line applies a second sensing gate signal to the third switching element.

In one example embodiment, the color filter substrate may further include a first transparent connecting electrode, a second transparent connecting electrode and a third transparent connecting electrode. The first transparent connecting electrode connects the first electrode layer to the first switching element. The second transparent connecting electrode connects the second electrode layer to the second switching element. The third transparent connecting electrode connects the third electrode layer to the third switching element.

In one example embodiment, the color filter substrate may further include a first capacitor, a second capacitor and a third capacitor. The first capacitor may be integrally formed between the first sensing gate line and the first switching element. The first capacitor is electrically charged with a first charge by photon-generated charges produced in response to absorption of the first color light. The second capacitor may be integrally formed between the first sensing gate line and the second switching element. The second capacitor is electrically charged with a second charge by photon-generated charges produced in response to absorption of the second color light. The third capacitor may be integrally formed between the second sensing gate line and the third switching element. The third capacitor is electrically charged with a third charge by photon-generated charges produced in response to absorption of the third color light.

In one example embodiment, the first electrode layer and the second electrode layer may be transparent, and the third electrode layer may be opaque and/or reflective.

In one example embodiment, the color filter substrate may further include a light-blocking pattern covering one side of the photonic sensor.

In accordance with further still another aspect of the present disclosure, a color filter substrate includes an array substrate, a color filter substrate, and a liquid crystal layer disposed between the array substrate and the color filter substrate. The array substrate includes a gate line and a data line crossing with the gate line. The color filter substrate includes an photonic sensor and a color filter pattern. The photonic sensor is formed on a substrate to sense a first light, a second light and a third light. The color filter pattern is formed on the substrate on which the photonic sensor is formed. The color filter pattern includes a plurality of color filters. The photonic sensor includes a first electrode layer, a second electrode layer, a third electrode layer, a first photon absorption layer, a second photon absorption layer, a third photon absorption layer and a blocking layer. The first electrode layer is formed on the substrate. The first electrode layer receives a first voltage. The second electrode layer receives a second voltage different from the first voltage. The third electrode layer receives a third voltage. The first photon absorption layer overlaps with the first electrode layer and receives the first voltage. The first photon absorption layer includes a first nanoparticle and senses a first color light. The second photon absorption layer overlaps with the second electrode layer and receives the second voltage. The second photon absorption layer includes a second nanoparticle having a size different from a size of the first nanoparticle. The second photon absorption layer senses a second color light. The third photon absorption layer overlaps with the third electrode layer and receives the third voltage. The third photon absorption layer includes a third nanoparticle having a size different from the sizes of the first nanoparticle and the second nanoparticle. The third photon absorption layer senses a third color light. The blocking layer is formed between the first photon absorption layer and the second photon absorption layer. The blocking layer blocks a flow of charge between the first photon absorption layer and the second photon absorption layer. The color filter pattern is formed on the substrate on which the photonic sensor is formed. The color filter pattern includes a plurality of color filters.

In one example embodiment, a first data line of the lower substrate may be overlapped by the first voltage line of the upper substrate, a second data line of the lower substrate may be overlapped by the second voltage line, and the second sensing gate line may overlap with the gate line of the lower substrate.

According to some example embodiments, the photonic sensor having high quantum efficiency may be used in the display device. The photonic sensor of the display device may scan an image or sense a touched position according to the scan mode or the sensing mode by using light generated from the backlight unit and reflected back to sensors of the color filter substrate by a screen adjacent object. The display device including the photonic sensor does not require a plurality of infrared ray generation devices and a plurality of detecting devices. Therefore, power consumption of the display device may be reduced, and the cost of manufacturing the display device may be reduced relative to embodiments that rely on the plural IR sources and plural IR detectors.

BRIEF DESCRIPTION OF THE DRAWINGS

The above and other features and advantages of embodiments in accordance with the present disclosure of invention will become more apparent by describing in detail example embodiments thereof with reference to the accompanying drawings, in which.

DETAILED DESCRIPTION

Figure 1A:
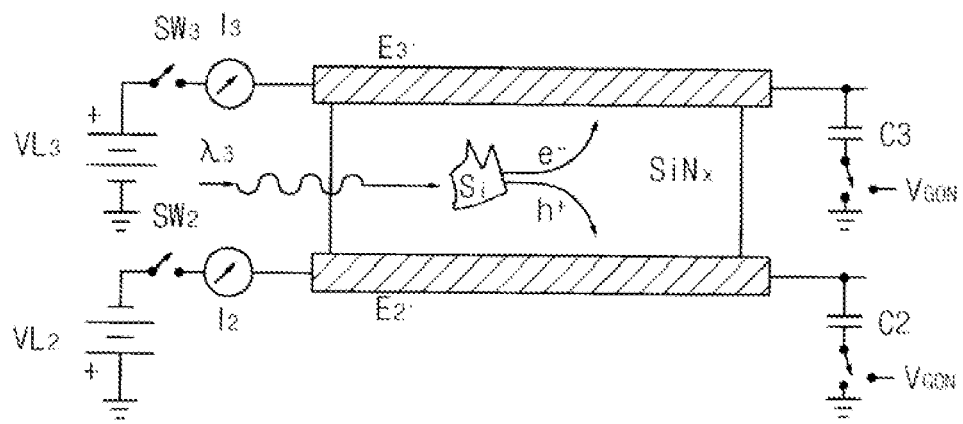
FIGS. 1A and 1B are concept diagrams explaining a basic operation of a quantum dot photo detector.

The present disclosure is provided more fully hereinafter with reference to the accompanying drawings, in which example embodiments are shown and described. The present teachings may, however, be embodied in many different forms and should not be construed as limited to the example embodiments set forth herein. Rather, these example embodiments are provided so that this disclosure will be thorough and complete, and will fully convey the scope of the present teachings to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present teachings. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this disclosure most closely pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments in accordance with the disclosure will be explained in detail with reference to the accompanying drawings.

Figure 1B:
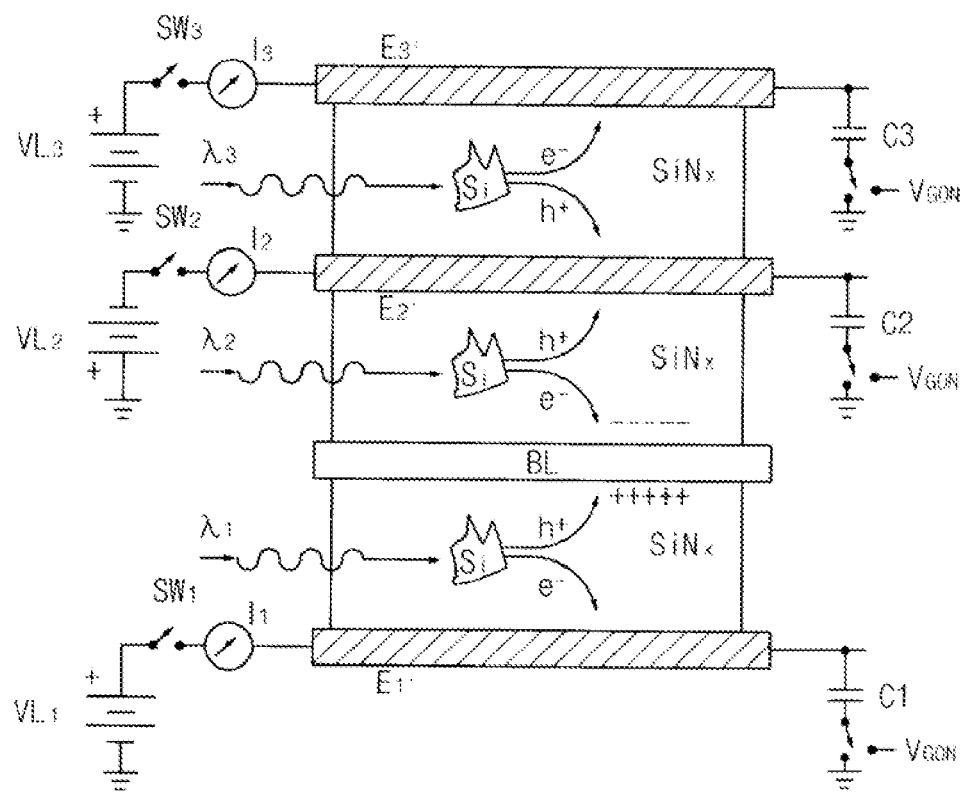

FIGS. 1A and 1B are concept diagrams explaining a basic operation of a quantum dot photo detector.

Referring to FIG. 1A, a basic operation of a quantum dot photon detector will first be described. E3' is a conductive electrode that will be referred to herein as the third electrode. Similarly E2' is a conductive electrode that will be referred to herein as the second electrode. In one embodiment, each of E2' and E3' is a transparent electric conductor. Interposed between electrodes E2' and E3' is a silicon nitride hosting body (of composition SiNx, where x can be a non-stoichiometric value) that has silicon nanoparticles (Si, only one shown) distributively embedded therein. For purpose of introductory explanation, a positive voltage +VL3 is applied to electrode E3' by way of temporarily closed switch SW3 and a negative −VL2 is applied to electrode E2' by way of temporarily closed switch SW2 to thereby establish an electric field through the silicon nitride body (SiNx). Then, when photons of appropriate wavelength ($\lambda 3$) are applied to the body and absorbed by the silicon nanoparticles (Si), corresponding electron-hole pairs are generated. Due to the extant electric field, electrons (e−) of the formed pairs are drawn to the positive electrode (E3') and holes (h+) are drawn to the negative electrode (E2'). If current meters (I3 and I2) are present, they would register the photon absorption events as draws of electrical current.

Still referring to FIG. 1A, next assume that before photons of appropriate wavelength ($\lambda 3$) are applied, switches SW2 and SW3 are closed and then opened while the bottom switches of illustrated capacitances C2 and C3 are each set to connect the bottom terminals of those capacitances to ground. As a result, the top of C3 is charged to +VL3 and the top of C2 is charged to −VL2. Then the photons of the appropriate, nanoparticle absorbed wavelength ($\lambda 3$) are applied. Corresponding electron-hole pairs are again generated where free electrons (e−) are drawn to and extinguished at the positive electrode (E3') while free holes (h+) are drawn to and extinguished at the negative electrode (E2'). This time, the photon absorption events are not registered by the current meters I3, I2 but rather by corresponding reduction of absolute magnitude of charged voltage across C3 and C2 respectively. More specifically, C3 is discharged by action of the electrode absorbed free electrons (e−) to have a voltage below +VL3 and C2 is discharged by action of the electrode absorbed free holes (h+) to have a voltage above −VL2.

Lastly, before moving on to explain FIG. 1B, consider a case similar to the immediate above except that the bottom switches of illustrated capacitances C2 and C3 are each set to connect the bottom terminals of those capacitances to a provided reference voltage, VGon. As a result, before the photons of the appropriate, nanoparticle absorbed wavelength ($\lambda 3$) are applied, C3 is charged to have the voltage, +VL3-VGon thereacross and C2 is charged to have the voltage, −VL2-VGon provided thereacross. Later, when the photons of appropriate wavelength ($\lambda 3$) are applied, C3 is discharged to have a voltage less than +VL3-VGon formed thereacross and C2 is discharged to have a voltage greater than −VL2-VGon formed thereacross.

Now referring to the more complex arrangement in FIG. 1B, it may be appreciated that, on their own, electrodes E3' and E2' behave as has been described immediately above. However, in the case of FIG. 1B, provided directly below second electrode E2' there is a second silicon nitride body (of composition SiNx", where x" can be a non-stoichiometric value) that has corresponding silicon nanoparticles (Si, only one shown) embedded therein where the Si particles of the second SiNx" body are structured to absorb photons of a corresponding second wavelength ($\lambda 2$) different from that of the already mentioned third wavelength ($\lambda 3$). Then, directly below the second nanoparticle-hosting silicon nitride body (SiNx") there is provided a thin, nonconductive "blocking layer" (BL) that can function as a dielectric of a to be described capacitance. The "blocking layer" (BL) may be formed of intrinsic silicon or of a semiconductive oxide or of other appropriate dielectric materials such as a silicon nitride that does not have nanoparticles embedded therein. In one embodiment, the blocking layer (BL) material is selected to let a predefined first wavelength ($\lambda 1$) pass through.

Additionally in FIG. 1B, provided directly below the "blocking layer" (BL), there is a so-called, first silicon nitride body (of composition SiNx', where x' can be a non-stoichiometric value) that has corresponding silicon nanoparticles (Si, only one shown) embedded therein where the Si particles of the first SiNx' body are structured to absorb photons of a corresponding first wavelength ($\lambda 1$) different from that of the already mentioned second and third wavelengths ($\lambda 2$ and $\lambda 3$). Then, directly below the first nanoparticle-hosting silicon nitride body (SiNx') there is provided a so-called first conductive electrode, E1'. The first electrode, E1' is connected for purpose of explanation to corresponding charging source, +VL1, first switch Sw1, current registering meter I1 and voltage change storing capacitance, C1. Hereinafter, the topmost silicon nitride body of FIG. 1B will be referred to also as the third silicon nitride body (of respective composition SiNx'").

After each of the first through third electrodes, E1', E2', E3' are pre-charged to respective pre-charge voltages, +VL1, −VL2 and +VL3, when both of the first and second wavelengths ($\lambda 1$ and $\lambda 2$) are applied respectively to the first and second silicon nitride hosting bodies (SiNx' and SiNx"), the first and second capacitances, C1 and C2 will be correspondingly discharged by respectively generated free electrons (e−) of the first body (SiNx') and generated free holes (h+) of the second body (SiNx") while a temporary charge accumulates at the surface boundaries of the blocking layer (BL).

Those skilled in the art will appreciate from the above that the net voltage on the second capacitance, C2 will be the superposed result of free hole (h+) productions from the second and third host bodies as a result of nanoparticle absorptions of the second and third wavelengths ($\lambda 2$ and $\lambda 3$). The net voltage on the third capacitance, C3 will be the result of nanoparticle absorptions only by the third host body of corresponding third wavelength ($\lambda 3$) photons. The net voltage on the first capacitance, C1 will be the result of nanoparticle absorptions only by the first host body of corresponding first wavelength ($\lambda 1$) photons. Accordingly, intensities of photons applied in the respective first through third wavelengths ($\lambda 1$, $\lambda 2$ and $\lambda 3$) can be determined from the net voltages detected across corresponding first through third capacitances, C1, C2 and C3 after a controlled pre-charging has occurred followed by application of a mix of photons in the first through third wavelengths ($\lambda 1$, $\lambda 2$ and $\lambda 3$).

Figure 1C:
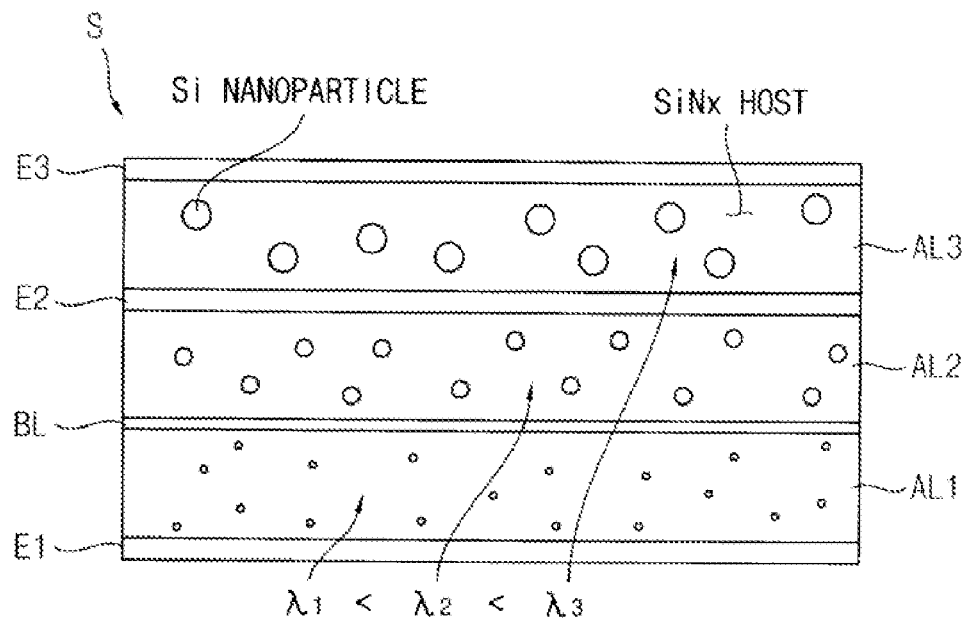
FIG. 1C is a cross-sectional view illustrating an photonic sensor in accordance with an example embodiment.

Given the above explanations of FIGS. 1A and 1B, it is to be appreciated that FIG. 1C is a cross-sectional view illustrating a photons sensor in accordance with a first example embodiment of the present disclosure and corresponding to the circuit model described for FIG. 1B.

More specifically, in FIG. 1C, the illustrated photons sensor S is shown to include a first electrode layer E1, a first photon absorption layer AL1, a blocking layer (or a charge blocking layer) BL, a second photon absorption layer AL2, a second electrode layer E2, a third photon absorption layer AL3 and a third electrode layer E3.

The first photon absorption layer AL1 the second photon absorption layer AL2 and the third photon absorption layer AL3 respectively respond to and thus sense absorption of photons of a first color light, of a second color light and of a third color light, respectively.

In one embodiment, the first photon absorption layer AL1 the second photon absorption layer AL2 and the third photon absorption layer AL3 respectively include a plurality of first nanoparticles, a plurality of second nanoparticles and a plurality of third nanoparticles, respectively. The first nanoparticles, the second nanoparticles and the third nanoparticles may have respective different sizes and/or energy couplings with their corresponding host bodies (AL1, AL2, AL3). The first nanoparticles, the second nanoparticles and the third nanoparticles play a role for the first photon absorption layer AL1, the second photon absorption layer AL2 and the third photon absorption layer AL3 to have sensitivities to different band gaps, so that absorptivity (and conversion of absorbed photons into corresponding electron-hole pairs) according to wavelengths and quantum efficiency may be optimized. In one embodiment, the sizes of the first nanoparticles, the second nanoparticles and the third nanoparticles are increased in said order of recitation (and as schematically indicated by different sized circles in FIG. 1C), and as a result the band gaps of the first photon absorption layer AL1, the second photon absorption layer AL2 and the third photon absorption layer AL3 are decreased in that order (($\lambda 1 < \lambda 2 < \lambda 3$).

The first photon absorption layer AL1, the second photon absorption layer AL2 and the third photon absorption layer AL3 may absorb the first color light, the second color light and the third color light, respectively, and may convert the absorbed light to photo-generated electrons and holes.

The amounts of such photoelectrons generated from the first photon absorption layer AL1, the second photon absorption layer AL2 and the third photon absorption layer AL3, respectively, are determined by intensities of radiation of the first color light, the second color light and the third color light corresponding to an image, and thus the photons sensor S may scan across light rays reflected from a nearby object and develop a colored image of that object based on light reflected from that object and thereby applied to the sensor S.

The first electrode layer E1 receives a first pre-charge voltage (V1), and the second electrode layer E2 receives a second pre-charge voltage (V2). The third electrode layer E3 receives a third pre-charge voltage (V3). The blocking layer BL is disposed between the first photon absorption layer AL1 and the second photon absorption layer AL2. The blocking layer BL may comprise a semiconductive oxide having a band gap larger than the band gaps of the first photon absorption layer AL1, the second photon absorption layer AL2 and the third photon absorption layer AL3. Since the blocking layer BL may comprise a semiconductive oxide having a band gap larger than the band gaps of the first to third photon absorption layers AL1, AL2; the blocking layer BL may function as a tunneling barrier, which blocks holes of the first photon absorption layer AL1 and electrons of the second photon absorption layer AL2 from extinguishing one another while at the same time allowing light of the first wavelength to pass through. That is, the blocking layer BL may block a flow of electric leakage charge between the first photon absorption layer AL1 and the second photon absorption layer AL2 while providing desired optical functions at the same time.

The first electrode layer E1, the first photon absorption layer AL1, the blocking layer BL, the second photon absorption layer AL2 and the second electrode layer E2 may form a first photon-to-charge transducer which may be thought of as a first, electron-hole pair generating, photo diode (D1) corresponding to the first color light and a second photon-to-charge transducer which may be thought of as a second such photo diode (D2) corresponding to the second color light. The second electrode layer E2, the third photon absorption layer AL3 and the third electrode layer E3 may form a third photon-to-charge transducer which may be thought of as a third photo diode (D3) corresponding to the third color light. (See briefly, FIG. 7.)

Figure 2:
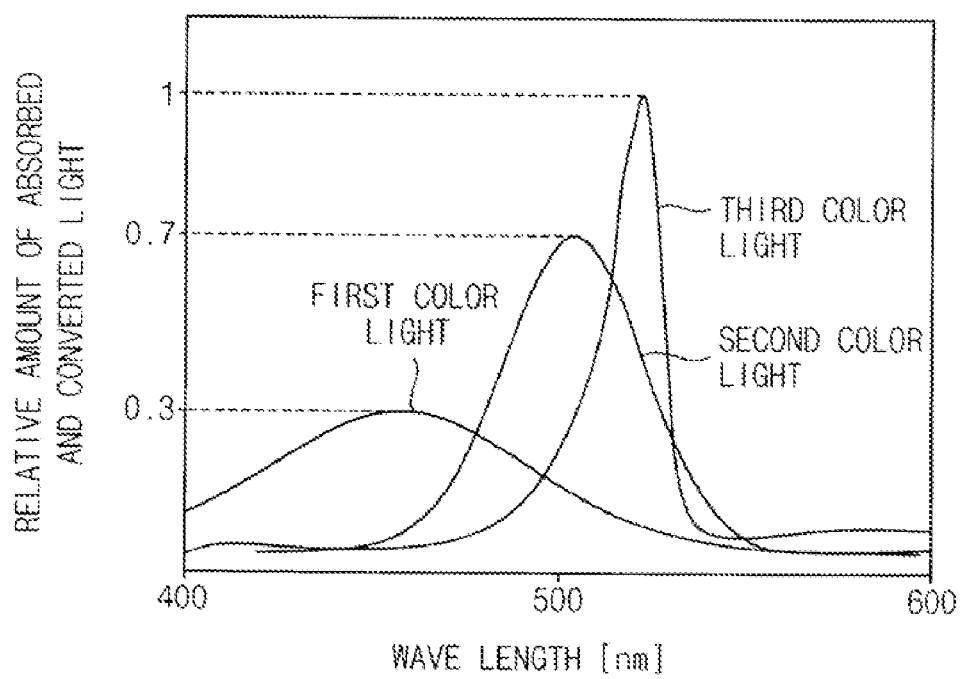
FIG. 2 is a graph showing relationships between wavelength and relative amounts of light absorbed by the first photon absorption layer, the second photon absorption layer and the third photon absorption layer, respectively, of FIG. 1C.

FIG. 2 is a graph showing relationships between wavelength (in terms of nanometers) and relative amounts of light absorbed and converted into electric charge by the first photon absorption layer, the second photon absorption layer and the third photon absorption layer, respectively, of FIG. 1C.

In the graph, the horizontal X-axis may represent Raman shift having a unit of a wave number, and a Y-axis represents a relative amount of light absorbed by the first nanoparticles, the second nanoparticles and the third nanoparticles respectively. The Y-axis has an arbitrary unit of normalized measure where maximum absorption by layer AL3 is normalized as 1.0. In one embodiment, the horizontal X-axis represents wavelength in terms of nanometers and those shows the visible light range in the 400-600 nm range.

Table 1 is a table for explaining different CVD deposition methods and their relationships to forming nano-particle impregnated silicon nitrides that can be used respectively as the first photon absorption layer, the second photon absorption layer and the third photon absorption layer of FIG. 1C.

More specifically, when a silicon nitride ($SiN_x$) substance is deposited on a substrate under appropriate conditions, isolated clusters of silicon (Si) may be formed within the silicon nitride ($SiN_x$) nano-particles hosting substance according to the utilized deposition conditions. The diameter of the silicon (Si) particles may have a unit of a few nanometers (nm) or less, and thus the nucleated silicon (Si) particle may be nano-particles and may serve as a distribution of quantum dots in a 3 dimensional host body.

Referring back to Table 1, cases where the silicon (Si) particles may precipitate and/or nucleate as nano-particles to be contained as such in the silicon nitride host ($SiN_x$) as a result of the deposition process correspond to condition A, condition D, condition G, condition H and condition I as is indicated by the layer being denoted as having both Si and SiNx.

That is, in the cases of the conditions A, D, G, H and I, the first photon absorption layer AL1, the second photon absorption layer AL2 and the third photon absorption layer AL3 may include the first nanoparticles, the second nanoparticles and the third nanoparticles of different average sizes, respectively. In these cases, CVD plasma deposition power is no more than about 300 watt (W), and deposition pressure is no more than about 1500 milli Torr (mTorr). The flow rate and concentration of supplied silane ($SiH_4$) is in a range between about 45 standard cubic centimeter per minute (sccm) and about 105 sccm.

Referring to FIG. 2, the absorption amount of the third light is the maximum when a wavelength is about 525 nanometers (nm). The absorption amount of the first light is the maximum when a wavelength is about 500 nm. The absorption amount of the second light is the maximum when a wavelength is about 450 nm.

When the normalized maximum absorption amount of the third light is defined as 1.0, then the relative absorption and conversion amount of the first light is about 0.7, and the relative absorption and conversion amount of the second light is about 0.3.

The graph shown in FIG. 2 is drawn using nano-particle containing materials formed in accordance with Table 1.

When the silicon nitride ($SiN_x$) and the silicon (Si) were deposited under the condition A and the condition I, the

TABLE 1

| Deposition Condition | Time sec | Power W | Spacing mm | Pressure mT | $N_2$ sccm | He sccm | $SiH_4$ sccm | Temp. °C. | Layer Formed |
|---|---|---|---|---|---|---|---|---|---|
| A* | 400 | 300 | 1000 | 1500 | 500 | 900 | 50 | 245 | $SiN_x$, Si |
| B | 400 | 500 | 1000 | 1500 | 500 | 900 | 50 | 245 | $SiN_x$ |
| C | 400 | 800 | 1000 | 1500 | 500 | 900 | 50 | 245 | $SiN_x$ |
| D* | 400 | 300 | 1000 | 1000 | 500 | 900 | 50 | 245 | $SiN_x$, Si |
| E | 400 | 300 | 1000 | 3000 | 500 | 900 | 50 | 245 | $SiN_x$ |
| F | 400 | 300 | 1000 | 1500 | 500 | 900 | 20 | 245 | $SiN_x$ |
| G* | 400 | 300 | 1000 | 1500 | 500 | 900 | 100 | 245 | $SiN_x$, Si |
| H* | 400 | 300 | 1000 | 1500 | 500 | 500 | 50 | 245 | $SiN_x$, Si |
| I* | 400 | 300 | 1000 | 1500 | 500 | 750 | 50 | 245 | $SiN_x$, Si |

Referring to FIGS. 1 and 2, and Table 1, the first photon absorption layer AL1, the second photon absorption layer AL2 and the third photon absorption layer AL3 may be formed by a chemical vapor deposition (CVD) method which utilizes silane and nitrogen to form the bulk hosting substance as a silicon nitride ($SiN_x$) where proportionality value x may vary. The first photon absorption layer AL1, the second photon absorption layer AL2 and the third photon absorption layer AL3 may include a nano-particles hosting substance composed of a silicon nitride ($SiN_x$) and nano-particles composed for example of crystalline silicon nano clusters (Si).

absorption amount of the second light was the maximum, and the average diameter of the second nanoparticles was about 20 nm.

When the silicon nitride ($SiN_x$) and the silicon (Si) were deposited according to the condition G and the condition H, the absorption amount of the first light was the maximum, and the average diameter of the first nanoparticles was under about 10 nm.

For example, in the condition G, the concentration of silane ($SiH_4$) for forming the first photon absorption layer AL1 is about 100 sccm larger than the concentration of silane ($SiH_4$)

for forming the second photon absorption layer AL2 which is about 50 sccm or the concentration of silane ($SiH_4$) for forming the third photon absorption layer AL3 which is about 50 sccm.

In the condition H, the concentration of helium (He) for forming the first photon absorption layer AL1 is about 500 sccm smaller than the concentration of helium (He) for forming the second photon absorption layer AL2 which is about 90 sccm or the concentration of helium (He) for forming the third photon absorption layer AL3 which is about 90 sccm.

When the silicon nitride ($SiN_x$) and the silicon nanoparticles (Si) were formed under the condition D, the absorption amount of the third light was the maximum, and the average diameter of the third nanoparticle was about 50 nm.

For example, in the condition D, the deposition pressure for forming the third photon absorption layer AL3 is about 1000 mTorr larger than the deposition pressure for forming the first photon absorption layer AL1 which is about 1500 mTorr or the deposition pressure for forming the second photon absorption layer AL2 which is about 1500 mTorr.

Accordingly, the first photon absorption layer AL1, the second photon absorption layer AL2 and the third photon absorption layer AL3 are formed on the substrate according to the conditions A, D, G, H and I.

FIGS. 3A to 3G are cross-sectional views describing a method of forming the image sensor illustrated in FIG. 1C.

Figure 3A:
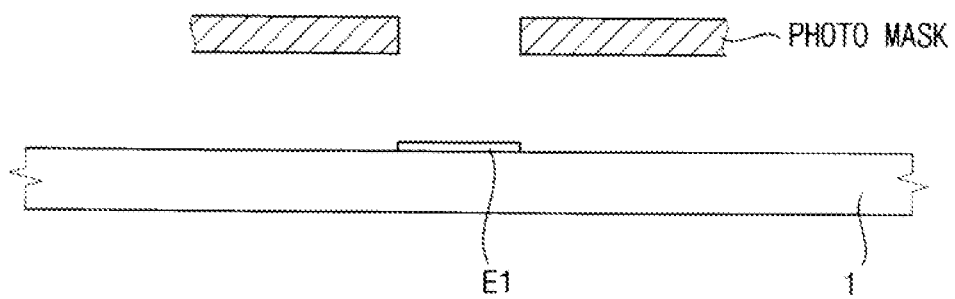
FIGS. 3A to 3G are cross-sectional views describing method of forming the image sensor illustrated in FIG. 1C.

Referring to FIGS. 1C and 3A, the first electrode layer E1 is formed on an electrically insulating substrate 1 (e.g., glass). The first electrode layer E1 may be transparent to visible light. Examples of materials for forming the first electrode layer E1 include indium tin oxide (ITO), indium zinc oxide (IZO), etc. The top view pattern of the deposited first electrode layer E1 may be defined by masked etching or by deposition into a hole of a removable masking material (not shown).

Figure 3B:
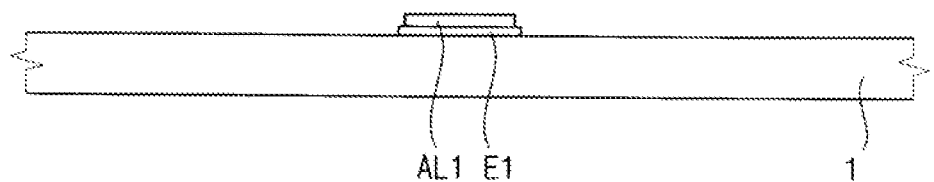

Referring to FIG. 1C, Table 1 and FIG. 3B, the first photon absorption layer AL1 is formed by the CVD method on the substrate 1 on which the first electrode layer E1 of FIG. 3A is formed. The first photon absorption layer AL1 may be deposited on the substrate 1 under the condition G and the condition H of Table 1.

Figure 3C:
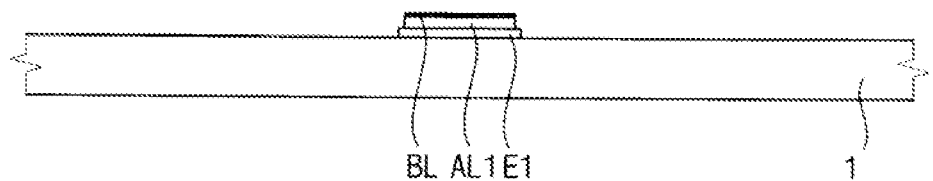

Referring to FIGS. 1C and 3C, the blocking layer BL is formed on the substrate 1 on which the first photon absorption layer AL1 is formed. The blocking layer BL may comprise an semiconductive oxide having a band gap larger than the band gaps of the first photon absorption layer AL1, the second photon absorption layer AL2 and the third photon absorption layer AL3. Therefore, the blocking layer BL may function as a tunneling barrier, which blocks charge carriers of the first photon absorption layer AL1 and the second photon absorption layer AL2. That is, the blocking layer BL may block a flow of electric leakage charge between the first photon absorption layer AL1 and the second photon absorption layer AL2.

Figure 3D:
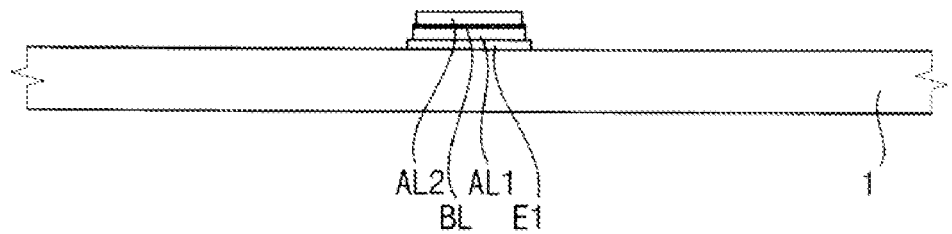

Referring to FIG. 1C, Table 1 and FIG. 3D, the second photon absorption layer AL2 is formed by the CVD method on the substrate 1 on which the blocking layer BL is formed. The second photon absorption layer AL2 may be deposited on the substrate 1 under the condition A and the condition I of Table 1.

Figure 3E:
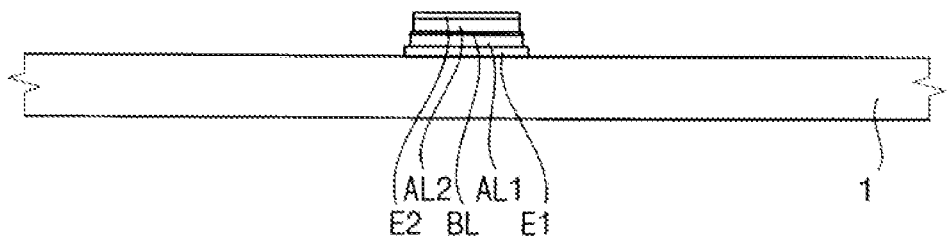

Referring to FIGS. 1C and 3E, the second electrode layer E2 is formed on the substrate 1 on which the second photon absorption layer AL2 is formed. The second electrode layer E2 may be transparent. Examples of materials for forming the second electrode layer E2 include indium tin oxide (ITO), indium zinc oxide (IZO), etc.

Figure 3F:
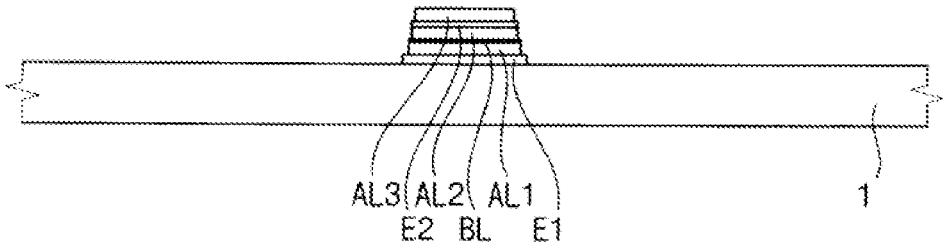

Referring to FIG. 1C, Table 1 and FIG. 3F, the third photon absorption layer AL3 is formed by the CVD method on the substrate 1 on which the second electrode layer E2 is formed. The third photon absorption layer AL3 may be deposited on the substrate 1 under the condition D of Table 1.

Figure 3G:
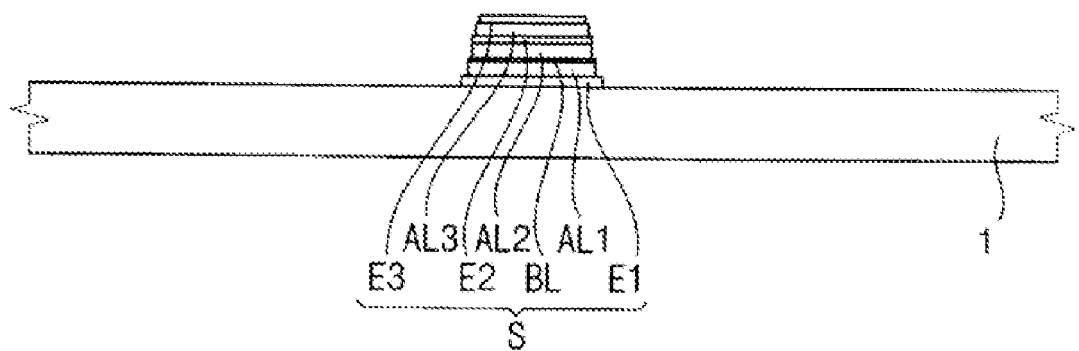

Referring to FIGS. 1C and 3G, the third electrode layer E3 is formed on the substrate 1 on which the third photon absorption layer AL3 is formed. The third electrode layer E3 may comprise an opaque metal layer (e.g., a reflective metal layer). Examples of materials for forming the third electrode layer E3 include copper (Cu), aluminum (Al), molybdenum (Mo), etc.

Figure 4:
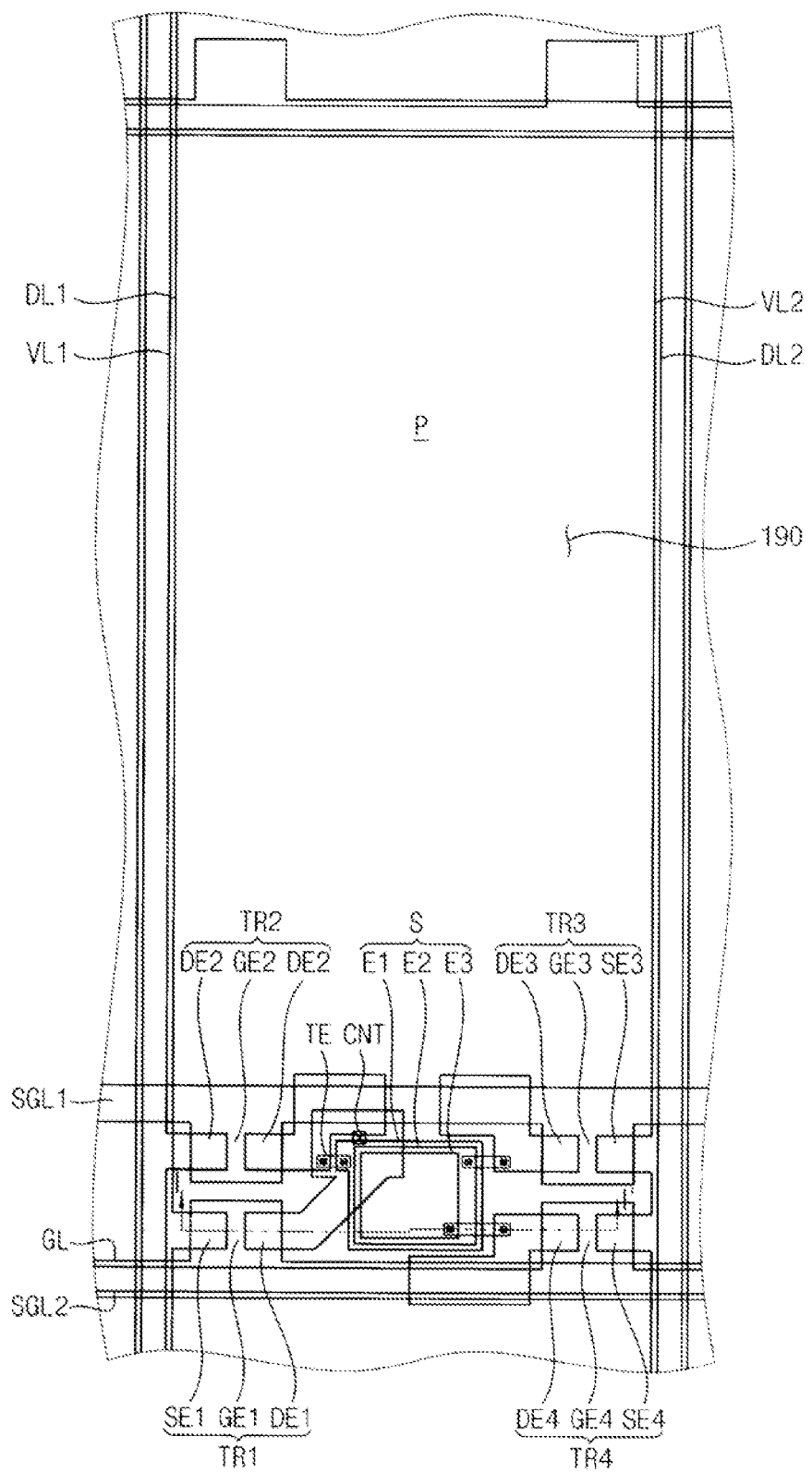
FIG. 4 is a plan view illustrating a display device in accordance with an example embodiment.
Figure 5:
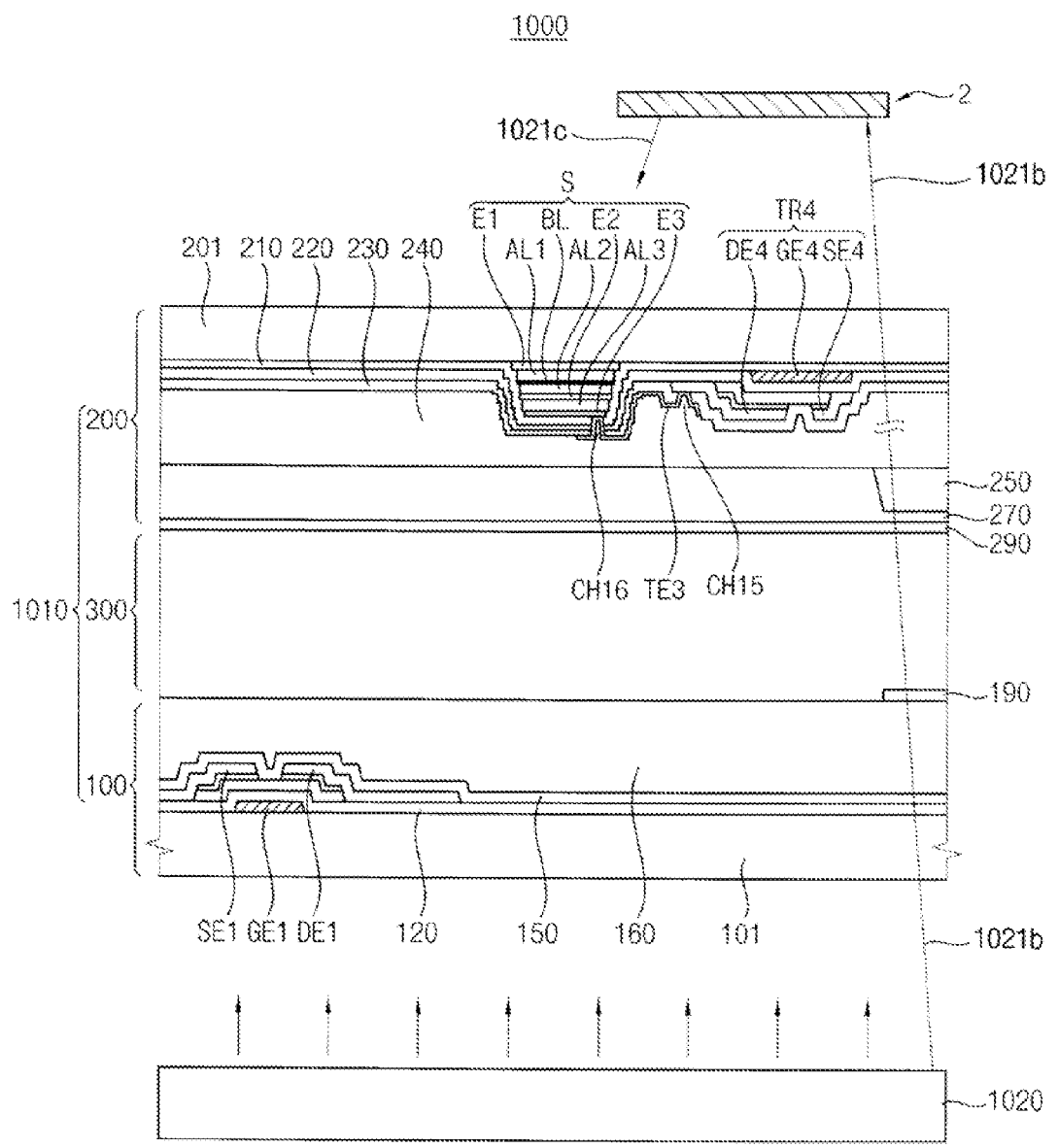
FIG. 5 is a cross-sectional view taken along I-I' in FIG. 4.
Figure 6:
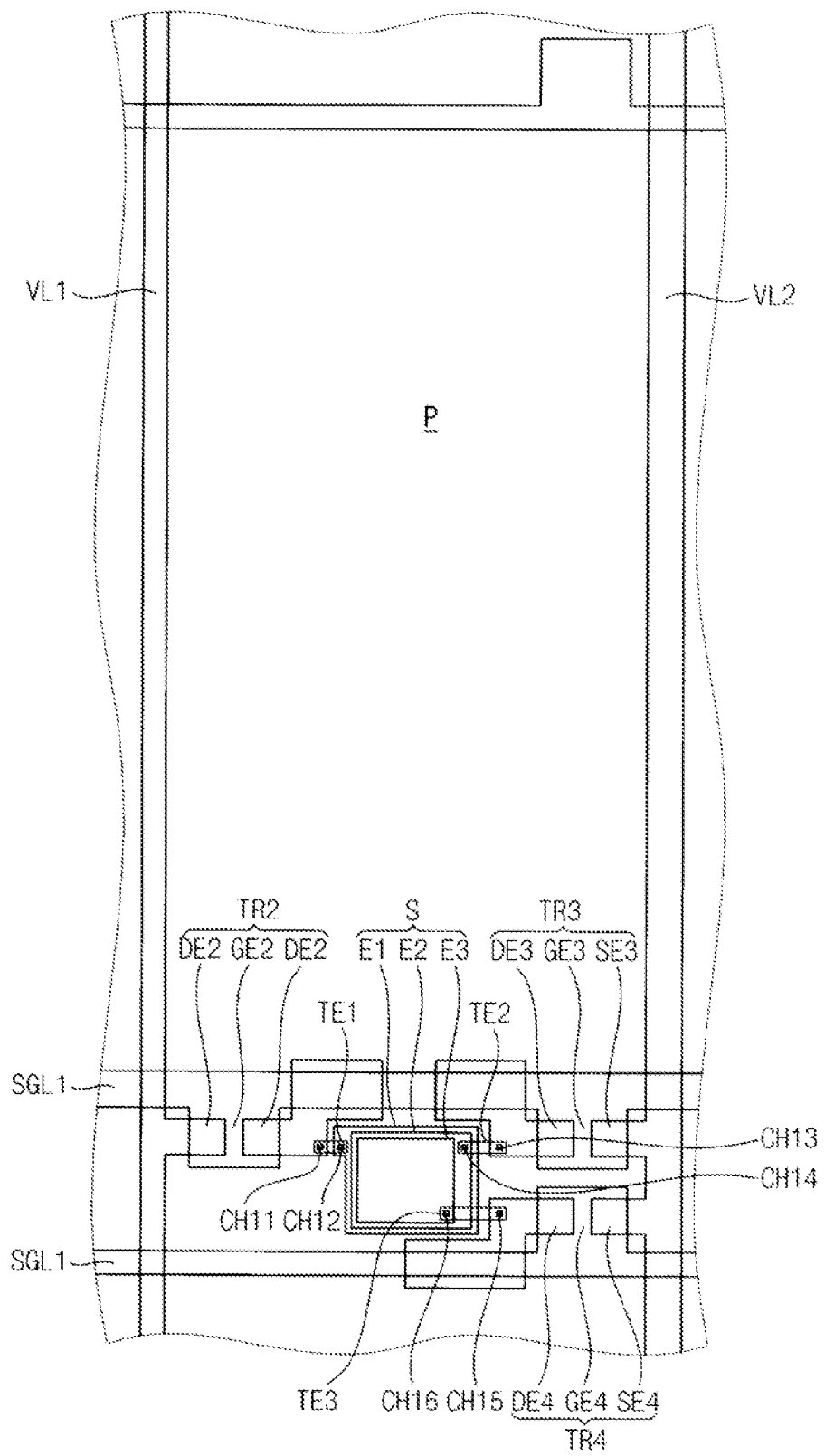
FIG. 6 is a plan view illustrating a color filter substrate illustrated in FIG. 4.

FIG. 4 is a plan view illustrating an example one of repeated pixel units in a display device 1000 in accordance with an example embodiment where a top view of sensor S is seen. FIG. 5 is a cross-sectional view taken along I-I' in FIG. 4. FIG. 6 is a simplified plan view illustrating a color filter substrate illustrated in FIG. 4.

Referring to FIG. 1C and FIGS. 4 to 6, a display device 1000 includes a display panel 1010 and a backlight unit 1020.

The display panel 1010 includes an array substrate 100, a color filter substrate 200 and a liquid crystal layer 300.

The display panel 1010 may have the integrally provided functionalities of being able to visually sense the image of a screen-adjacent object and being able to function as a touch sensitive panel.

For example, when the display device 1000 is in a display mode, the display panel 1010 displays an image according to a supplied image substrate. On the other hand, when the display device 1000 is in an image sensing or scan mode, the display panel 1010 scans the image of a screen-adjacent object (e.g., 2 of FIG. 5). Thirdly, when the display device 1000 is in a touch sensing mode, the display panel 1010 senses a touched position on its screen.

Referring to FIG. 5, the array substrate portion 100 of the display device 1000 includes a first base substrate 101 made of a transparent material (e.g., glass) and on which an illustrated one of plural pixel areas, P is defined. A gate line GL, a first data line DL1, a second data line DL2, a first switching element TR1 and a pixel electrode 190 are formed on the first base substrate 101.

The gate line GL may extend in a first direction. The first and second data lines DL1 and DL2 may extend in a second direction crossing with the first direction. The first and second data lines DL1 and DL2 may be disposed to be adjacent to each other.

The first switching element TR1 may be disposed at a region adjacent to the crossing region of the gate line GL and the first data line DL1. The first switching element TR1 includes a first gate electrode GE1 integrally connected to the gate line GL, a first source electrode SE1 integrally connected to the first data line DL1, and a first drain electrode DE1 connected to the pixel electrode 190 for example through a contact via portion CNT, where the first drain electrode DE1 is separated from the first source electrode SE1.

The array substrate 100 may further include a lower gate insulation layer 120, a lower inorganic insulation layer 150 and a lower organic insulation layer 160.

The spaced apart color filter substrate 200 includes a second base substrate 201. An image sensor S, a first sensing gate line SGL1, a second sensing gate line SGL2, a first voltage line VL1, a second voltage line VL2, a second switching element TR2, a third switching element TR3, a fourth switching element TR4, a light-blocking pattern 240, a color filter pattern 250, an overcoat layer 270 and a common electrode 290 are formed on the second base substrate 201. The color filter pattern 250 of each pixel unit is selected from a plurality of differently colored color filters. For example, the color filters may include a blue color filter, a green color filter, a red color filter and a white (clear) color filter (RGBW).

The image sensor illustrated in FIG. 1C may be used as the image sensor S of FIG. 5.

When the display device 1000 is in the image scanning mode, light generated from the backlight unit 1020 and passed through the color filters (e.g., RGBW) of the color filter substrate 200 strikes a to-be-imaged external object 2 adjacent to the screen and this display sourced light is then reflected back from the external object 2 to the image sensor S for sensing thereof by the image sensor S. The image sensor S senses the intensity of first color reflected light, second color reflected light and a third color reflected light included in the light reflected from the object 2 to thereby form a pixelated image of the object 2. For example, the first color light, the second color light and the third color light may correspond to a blue light, a green light and a red light, respectively.

When the display device 1000 is in the touch sensing mode, and the light generated from the backlight unit 1020 is again reflected on the external and this time, touching object 2 except that no light is reflected at the point of touch. The image sensor S senses a corresponding black image portion of the touching object 2 to thereby determine the touched position.

A sensor protection layer 210 may be formed above the image sensor S as shown in FIG. 5.

The first sensing gate line SGL1 and the second sensing gate line SGL2 may extend in the first direction on the sensor protection layer 210. The first voltage line VL1 and the second voltage line VL2 may extend in the second direction and be disposed to be adjacent to each other on the sensor protection layer 210.

The second switching element TR2 may be disposed at a region adjacent to the crossing region of the first sensing gate line SGL1 and the first voltage line VL1. The second switching element TR2 includes a second gate electrode GE2 connected to the first sensing gate line SGL1, a second source electrode SE2 connected to the first voltage line VL1, and a second drain electrode DE2 connected to the first electrode layer E1 of the image sensor S.

The first electrode layer E1 is formed on the second base substrate 201, and electrically connected to the second drain electrode DE2 of the second switching element TR2. For example, the first electrode layer E1 may be electrically connected to the second drain electrode DE2 through a first contact hole CH11 formed on the second drain electrode DE2, a first transparent electrode TE1 and a second contact hole CH12 formed on the first electrode layer E1.

The third switching element TR3 may be disposed at a region adjacent to the crossing region of the first sensing gate line SGL1 and the second voltage line VL2. The third switching element TR3 includes a third gate electrode GE3 connected to the first sensing gate line SGL1, a third source electrode SE3 connected to the second voltage line VL2, and a third drain electrode DE3 connected to the second electrode layer E2 of the image sensor S.

The second electrode layer E2 is formed on the second photon absorption layer AL2, and electrically connected to the third drain electrode DE3 of the third switching element TR3. For example, the second electrode layer E2 may be electrically connected to the third drain electrode DE3 through a third contact hole CH13 formed on the third drain electrode DE3, a second transparent electrode TE2 and a fourth contact hole CH14 formed on the second electrode layer E2.

The fourth switching element TR4 may be disposed at a region adjacent to the crossing region of the second sensing gate line SGL2 and the second voltage line VL2. The fourth switching element TR4 includes a fourth gate electrode GE4 connected to the second sensing gate line SGL2, a fourth source electrode SE4 connected to the second voltage line VL2, and a fourth drain electrode DE4 connected to the third electrode layer E3 of the image sensor S.

The third electrode layer E3 is formed on the third photon absorption layer AL3, and electrically connected to the fourth drain electrode DE4 of the fourth switching element TR4. For example, the third electrode layer E3 may be electrically connected to the fourth drain electrode DE4 through a fifth contact hole CH15 formed on the fourth drain electrode DE4, a third transparent electrode TE3 and a sixth contact hole CH16 formed on the third electrode layer E3.

The color filter substrate 200 may further include an upper gate insulation layer 220 and an upper inorganic insulation layer 230.

Referring back to FIGS. 4 and 5, the gate line GL of the array substrate 100 overlaps the second sensing gate line SGL2 of the color filter substrate 200. The first and second data lines DL1 and DL2 of the array substrate 100 overlap the first and second voltage lines VL1 and VL2. The second, third and fourth switching elements TR2, TR3 and TR4 of the color filter substrate 200 are formed to be adjacent to the first switching element TR1 of the array substrate 100. Accordingly, the signal lines and the switching elements of the array substrate 100 are formed to be overlapped with the signal lines and the switching elements of the color filter substrate 200, so that an aperture ratio is not decreased by provision of the sensors (S) and sensor switching elements (Tr2-Tr4) in the black matrix covered area that is also used by the pixel unit switching element Tr1 of the lower substrate 100.

Figure 7:
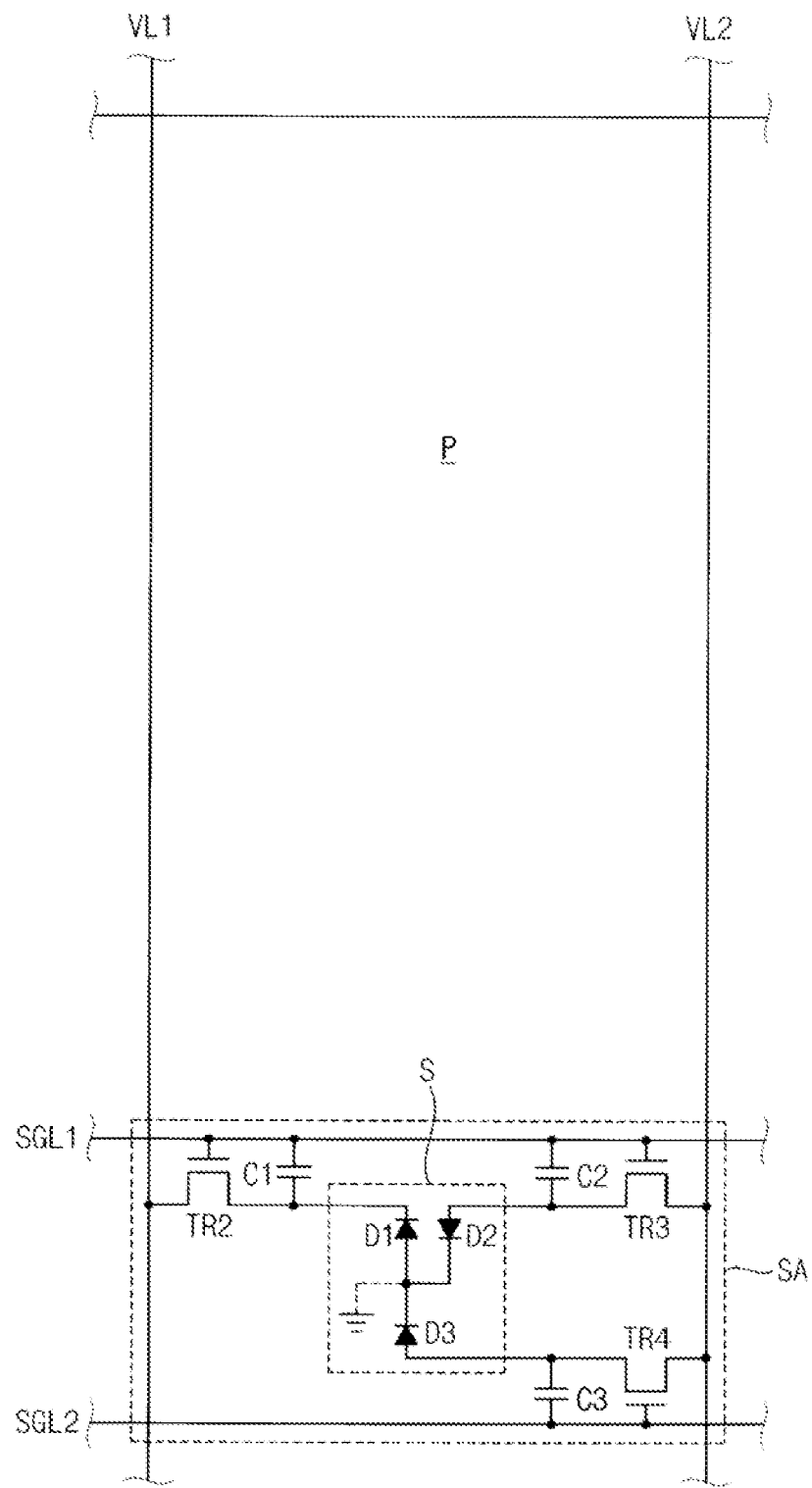
FIG. 7 is an equivalent circuit of the color filter substrate illustrated in FIG. 6.

FIG. 7 is an equivalent circuit of the color filter substrate illustrated in FIG. 6 wherein the illustrated photodiodes D1-D3 represent the electron-hole pair generating entities of corresponding layers AL1-AL3.

Referring to FIGS. 5 to 7, the pixel area P may be defined on the color filter substrate 200 by the first voltage line VL1, the second voltage line VL2 and the first sensing gate line SGL1. Further, a sensing area SA is defined on the color filter substrate 200 by the first voltage line VL1, the second voltage line VL2, the first sensing gate line SGL1 and the second sensing gate line SGL2.

The second switching element TR2, the third switching element TR3, the fourth switching element TR4 and the image sensor S are formed in the sensing area SA.

A first capacitor C1 is formed by the second drain electrode DE2 and the first sensing gate line SGL1 overlapping with each other. An anode of a first photo diode D1 is connected to the second drain electrode DE2. The first capacitor C1 is electrically charged or discharged according to an amount of current that flows from the first photo diode D1 when illuminated by appropriate wavelengths.

For example, when the first sensing gate line SGL1 is activated and the second switching element TR2 is turned on by a first gate sensing signal applied from the activated first sensing gate line SGL1, a current based on a first voltage of the first voltage line VL1 flows from the first photo diode D1, and the first capacitor C1 may be charged or discharged according to the amount of the current flowing through the first photo diode D1. Since the amount of the current is determined by the amount of photoelectrons generated by the first color light, the amount of the current flowing through the first photo diode D1 is determined by the amount of the first color light irradiated to the image sensor S.

A second capacitor C2 is formed by the third drain electrode DE3 and the first sensing gate line SGL1 overlapping with each other. An anode of a second photo diode D2 is connected to the third drain electrode DE3. The second capacitor C2 is electrically charged according to an amount of current flowing from the second photo diode D2.

For example, when the first sensing gate line SGL1 is activated and the third switching element TR3 is turned on by the first gate sensing signal applied from the activated first sensing gate line SGL1, a current based on a second voltage of the second voltage line VL2 flows through the second photo diode D2, and the second capacitor C2 may be charged or discharged according to the amount of the current flowing through the second photo diode D2. Since the amount of the current is determined by the amount of photoelectrons generated by the second color light, the amount of the current flowing through the second photo diode D2 is determined by the amount of the second color light irradiated to the image sensor S.

The blocking layer BL is formed between the first photon absorption layer AL1 and the second photon absorption layer AL2, and the first electrode layer E1 and the second electrode layer E2 receive the first voltage and the second voltage that are different from each other, respectively. Accordingly, the first electrode layer E1, the first photon absorption layer AL1, the blocking layer BL, the second photon absorption layer AL2 and the second electrode layer E2 may form the first photo diode D1 and the second photo diode D2.

The first color light is absorbed into only the first photon absorption layer AL1, and the current is generated as much as the amount of the first color light absorbed into the first photon absorption layer AL1. As more current is generated in response to more light, the more electric charges may be charged or discharged in the first capacitor C1. The second color light is absorbed into only the second photon absorption layer AL2, and the current is generated as much as the amount of the second color light absorbed into the second photon absorption layer AL2. The more current is generated, the more electric charges may be charged or discharged in the second capacitor C2.

A third capacitor C3 is formed by the fourth drain electrode DE4 and the second sensing gate line SGL2 overlapping with each other. An anode of a third photo diode D3 is connected to the fourth drain electrode DE4. The third capacitor C3 is electrically charged according to an amount of current flowing from the third photo diode D3.

For example, when the second sensing gate line SGL2 is activated and the fourth switching element TR4 is turned on by the second gate sensing signal applied from the activated second sensing gate line SGL2, a current based on the second voltage of the second voltage line VL2 flows through the third photo diode D3, and the third capacitor C3 may be charged or discharged according to the amount of the current flowing through the third photo diode D3. Since the amount of the current is determined by the amount of photoelectrons generated by the third color light, the amount of the current flowing through the second photo diode D2 is determined by the amount of the third color light irradiated to the image sensor S.

The third photon absorption layer AL3 is formed between the second electrode layer E2 and the third electrode layer E3, and the third electrode layer E3 receives the second voltage. Accordingly, the second electrode layer E2, the third photon absorption layer AL3 and the third electrode layer E3 may form the third photo diode D3.

The third color light is absorbed into only the third photon absorption layer AL3, and the current is generated as much as the amount of the third color light absorbed into the third photon absorption layer AL3. The more current is generated, the more electric charges may be charged or discharged in the third capacitor C3.

That is, the amount of the current flowing through the first photo diode D1 and the amount of the electric charge charged into or discharged out of the first capacitor C1 are proportional to the amount of the first color light. The amount of the current flowing through the second photo diode D2 and the amount of the electric charge charged in the second capacitor C2 are proportional to the amount of the second color light. The amount of the current flowing through the third photo diode D3 and the amount of the electric charge charged into or discharged from the third capacitor C3 are proportional to the amount of the third color light.

The image sensor S thus determines the quantities of the electric charges that will be respectively pre-charged in the first, second and third capacitors C1, C2 and C3 (while SGL1 and SGL2 are respectively at zero volts, i.e. ground), so that the display device 1000 may use these precharged amounts to sense the image.

FIGS. 8A to 8D are cross-sectional views describing a method of forming the color filter substrate illustrated in FIG. 5.

Referring to FIGS. 3A to 3G, and FIGS. 5, 6 and 8A, the image sensor S is formed on the second base substrate 201 by the processes described in FIG. 3A to FIG. 3G, and the sensor protection layer 210 is formed on the second base substrate 201 on which the third photon absorption layer AL3 is formed.

Figure 8A:
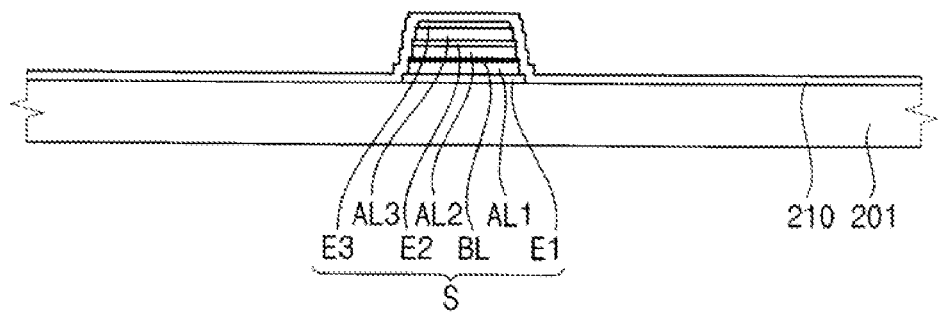
FIGS. 8A to 8D are cross-sectional views describing method of forming the color filter substrate illustrated in FIG. 5.
Figure 8B:
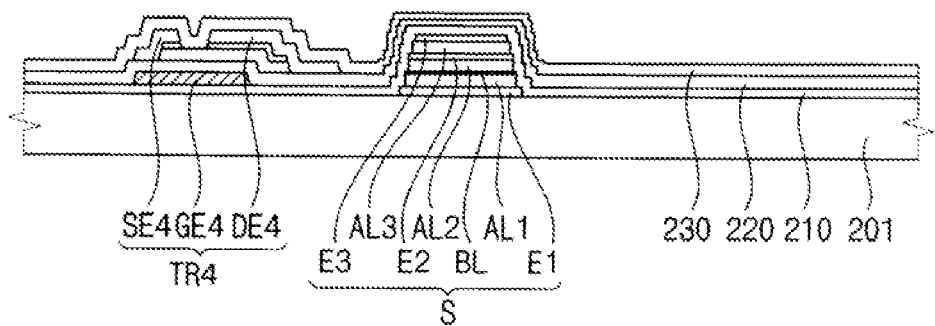

Referring to FIGS. 5, 6 and 8B, the second switching element TR2, the third switching element TR3 and the fourth switching element TR4 are formed on the second base substrate 201 on which the sensor protection layer 210 is formed TR4 is shown by way of illustration.

For example, the first sensing gate line SGL1, the second sensing gate line SGL2, the second gate electrode GE2, the third gate electrode GE3 and the fourth gate electrode GE4 are formed on the second base substrate 201 on which the sensor protection layer 210 is formed. The upper gate insulation layer 220 is formed. The first voltage line VL1, the second voltage line VL2, the second source electrode SE2, the second drain electrode DE2, the third source electrode SE3, the third drain electrode DE3, the fourth source electrode SE4 and the fourth drain electrode DE4 are formed. The upper inorganic insulation layer 230 is then formed.

Figure 8C:
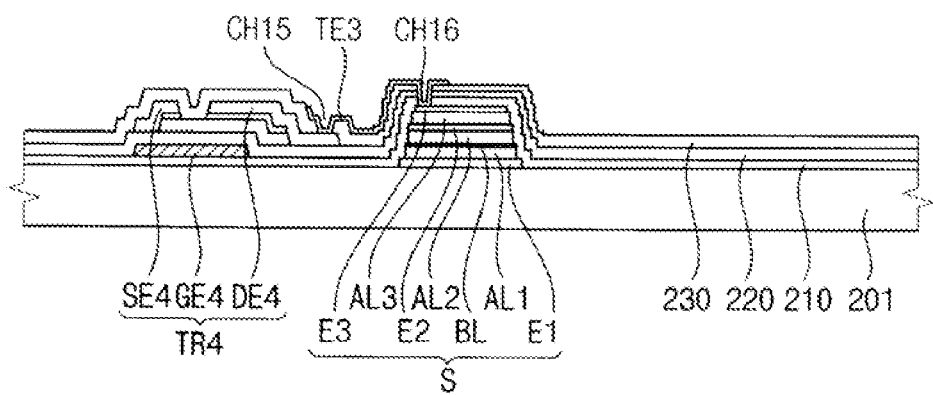

Referring to FIGS. 5, 6 and 8C, the upper inorganic insulation layer 230 on the second drain electrode DE2 is patterned to form the various contact holes including the first contact hole CH11 (see FIG. 6). The sensor protection layer 210, the upper gate insulation layer 220 and the upper inorganic insulation layer 230 formed on the image sensor S are patterned to form the second contact hole CH12. The first transparent electrode TE1 is formed on the upper inorganic insulation layer 230 to electrically connect the first electrode layer E1 to the second drain electrode DE2.

The upper inorganic insulation layer 230 on the third drain electrode DE3 is patterned to form the third contact hole CH13. The sensor protection layer 210, the upper gate insulation layer 220 and the upper inorganic insulation layer 230 formed on the image sensor S are patterned to form the fourth contact hole CH14. The second transparent electrode TE2 is formed on the upper inorganic insulation layer 230 to electrically connect the second electrode layer E2 to the third drain electrode DE3.

The upper inorganic insulation layer 230 on the fourth drain electrode DE4 is patterned to form the fifth contact hole CH15. The sensor protection layer 210, the upper gate insulation layer 220 and the upper inorganic insulation layer 230 formed on the image sensor S are patterned to form the sixth contact hole CH16. The third transparent electrode TE3 is formed on the upper inorganic insulation layer 230 to electrically connect the third electrode layer E3 to the fourth drain electrode DE4.

Figure 8D:
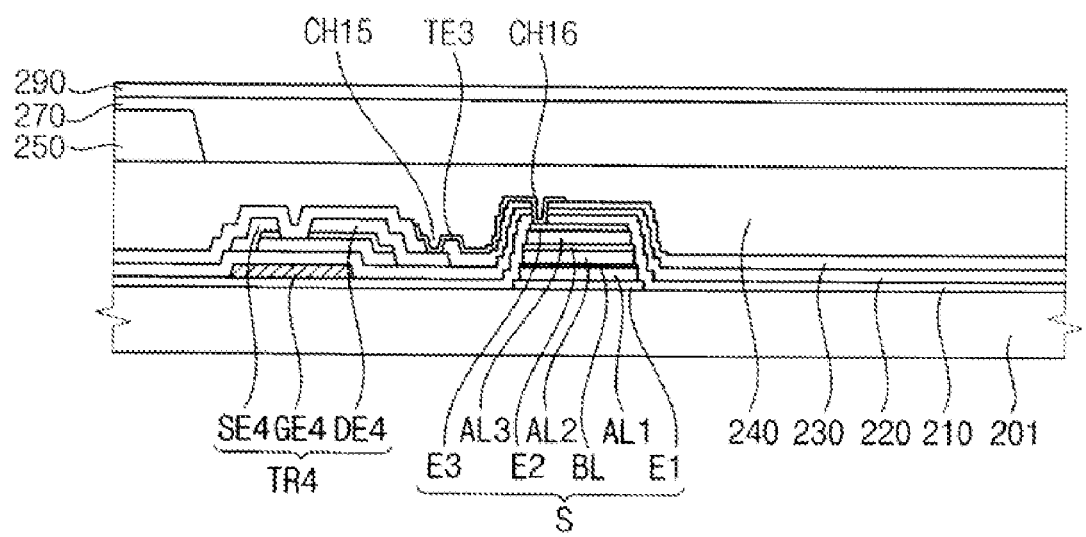

Referring to FIGS. 5, 6 and 8D, the light-blocking pattern 240, the color filter pattern 250, the overcoat layer 270 and the common electrode 290 are then formed on the second base substrate 201 on which the first, second and third transparent electrodes TE1, TE2 and TE3 are formed.

Although the light-blocking pattern 240 is formed on the image sensor S in this example embodiment, the color filter pattern 250 may instead be formed so as to directly overlay the image sensor S in place of the light-blocking pattern 240 or plural ones of differently colored color filters may overlap each other and directly overlay the image sensor S in place of the light-blocking pattern 240.

When the light-blocking pattern 240 is formed on the image sensor S, the third electrode layer E3 may be transparent and may comprise indium tin oxide (ITO), indium zinc oxide (IZO), etc.

According to the present disclosure, pre-charge voltages are applied to the first photon absorption layer AL1, the second photon absorption layer AL2 and the third photon absorption layer AL3 including the first nanoparticles, the second nanoparticles and the third nanoparticles, which have different sizes, respectively, and the blocking layer BL having a function of the tunneling barrier is formed between the first photon absorption layer AL1 and the second photon absorption layer AL2. Therefore, the image sensor having high quantum efficiency may be used in the display device. Further, the image sensor may scan an image or sense a touched position according to the scan mode or the sensing mode by using the light generated from the backlight unit 1020. Therefore, the display device including the image sensor does not require a plurality of separate infrared ray generation devices and a plurality of infrared detecting devices. Thus, power consumption of the display device may be reduced, and the cost of manufacturing the display device may be reduced while the functionality may be enhanced because both touch location determination and imaging of near-screen objects may be carried out by the same array of integrally provided sensors S.

Figure 9:
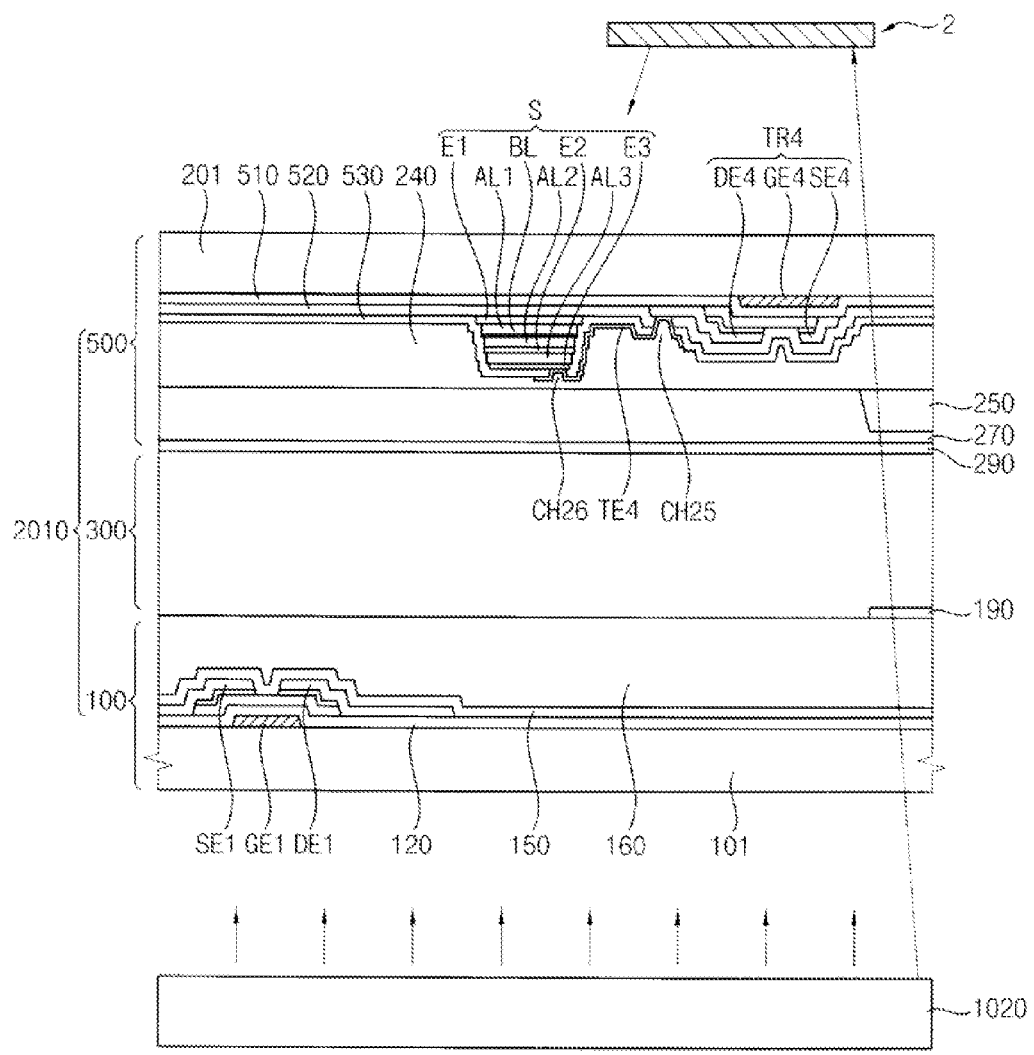
FIG. 9 is a cross-sectional view illustrating a display device in accordance with another example embodiment.

FIG. 9 is a cross-sectional view illustrating a display device in accordance with another example embodiment of the present disclosure. FIGS. 10A to 10J are cross-sectional views describing a method of forming the color filter substrate illustrated in FIG. 9.

Plan views of the display device 2000 and the color filter substrate 500 described in FIG. 9 are substantially the same as those described with reference to FIGS. 4 and 6. Therefore, the plan views of the display device 2000 and the color filter substrate 500 are omitted.

The display panel 2010 described with reference to FIG. 9 may be substantially the same as the display device described with reference to FIGS. 1 to 8 except that the image sensor S is formed after formation of the second switching element TR2, the third switching element TR3 and the fourth switching element TR4. Therefore, the same reference numbers are used for the same or similar elements, and any further descriptions concerning the same or similar elements as those shown in FIG. 1C to FIG. 8 will be omitted.

Figure 10A:
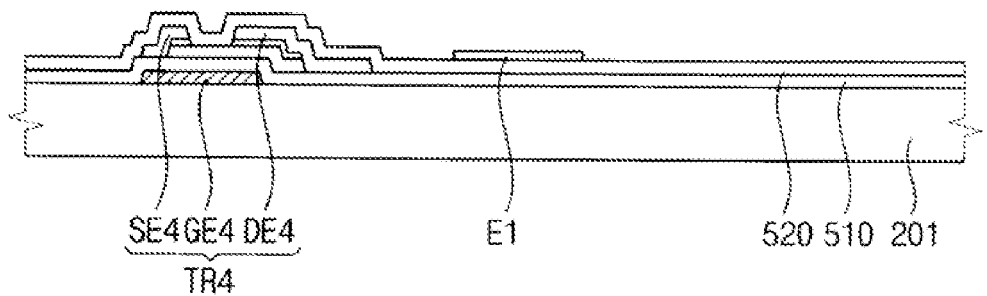
FIGS. 10A to 10J are cross-sectional views describing method of forming the color filter substrate illustrated in FIG. 9.

Referring to FIGS. 6, 9 and 10A, the second switching element TR2, the third switching element TR3 and the fourth switching element TR4 are formed on the second base substrate 201.

For example, the first sensing gate line SGL1, the second sensing gate line SGL2, the second gate electrode GE2, the third gate electrode GE3 and the fourth gate electrode GE4 are formed on the second base substrate 201. The upper gate insulation layer 510 is formed. The first voltage line VL1, the second voltage line VL2, the second source electrode SE2, the second drain electrode DE2, the third source electrode SE3, the third drain electrode DE3, the fourth source electrode SE4 and the fourth drain electrode DE4 are formed. The upper inorganic insulation layer 520 is formed.

Figure 10B:
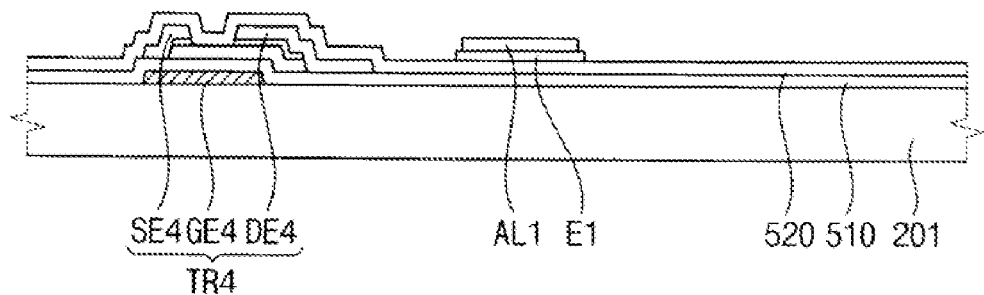

Referring to FIGS. 6, 9 and 10B, the first electrode layer E1 is then formed on the second base substrate 201 on which the upper inorganic insulation layer 520 is formed. Examples of materials for forming the first electrode layer E1 include indium tin oxide (ITO), indium zinc oxide (IZO), etc.

Referring to Table 1, FIGS. 6, 9 and 10B, the first photon absorption layer AL1 is formed by the CVD method on the second base substrate 201 on which the first electrode layer E1 is formed. The first photon absorption layer AL1 may be deposited on the second base substrate 201 under the condition G and the condition H of Table 1.

Figure 10C:
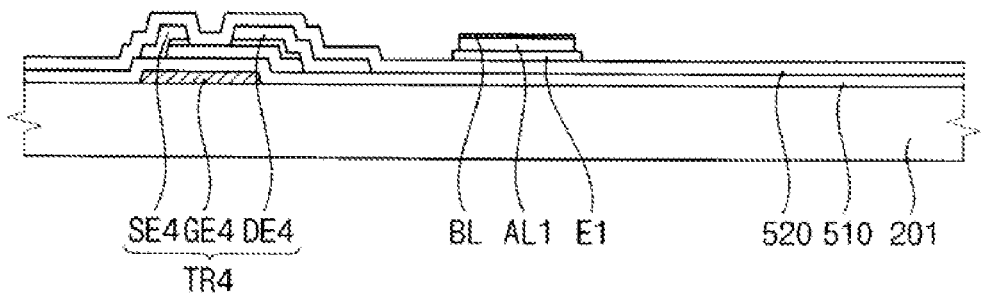

Referring to FIGS. 6, 9 and 10C, the blocking layer BL is formed on the second base substrate 201 on which the first photon absorption layer AL1 is formed. The blocking layer BL may comprise an semiconductive oxide having a band gap larger than the band gaps of the first photon absorption layer AL1, the second photon absorption layer AL2 and the third photon absorption layer AL3. Therefore, the blocking layer BL may function as a tunneling barrier.

Figure 10D:
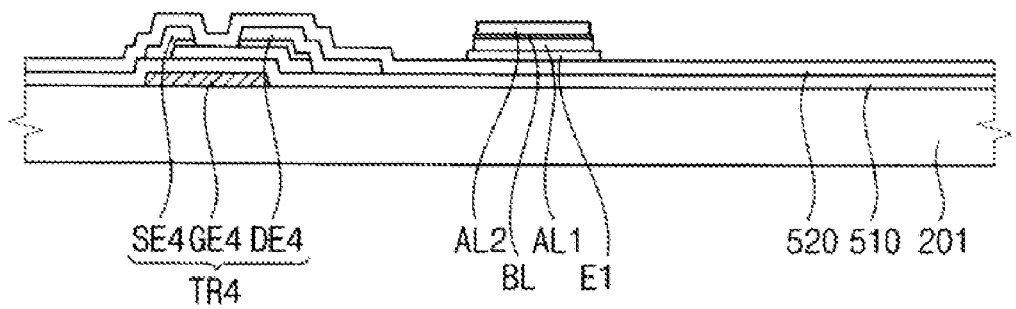

Referring to Table 1 and FIGS. 6, 9 and 10D, the second photon absorption layer AL2 is formed by the CVD method on the second base substrate 201 on which the blocking layer BL is formed. The second photon absorption layer AL2 may be deposited on the second base substrate 201 under the condition A and the condition I of Table 1.

Figure 10E:
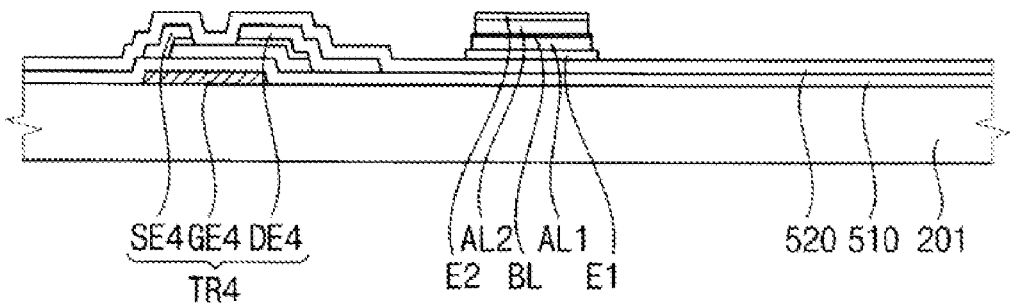

Referring to FIGS. 6, 9 and 10E, the second electrode layer E2 is formed on the second base substrate 201 on which the second photon absorption layer AL2 is formed. Examples of materials for forming the second electrode layer E2 include indium tin oxide (ITO), indium zinc oxide (IZO), etc.

Figure 10F:
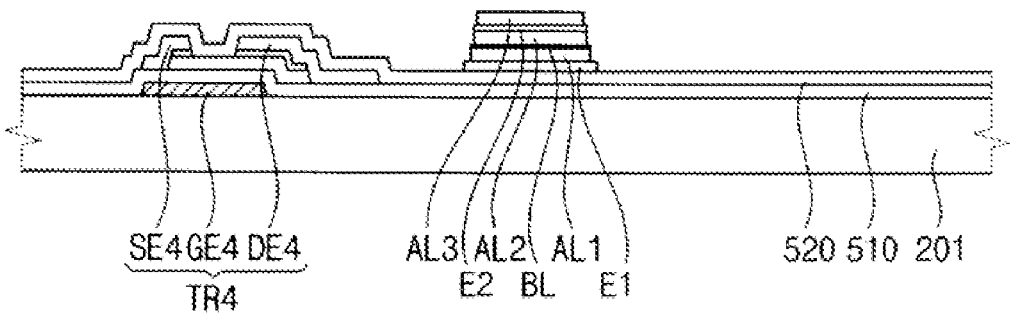

Referring to Table 1 and FIGS. 6, 9 and 10F, the third photon absorption layer AL3 is formed by the CVD method on the second base substrate 201 on which the second electrode layer E2 is formed. The third photon absorption layer AL3 may be deposited on the second base substrate 201 under the condition D of Table 1.

Figure 10G:
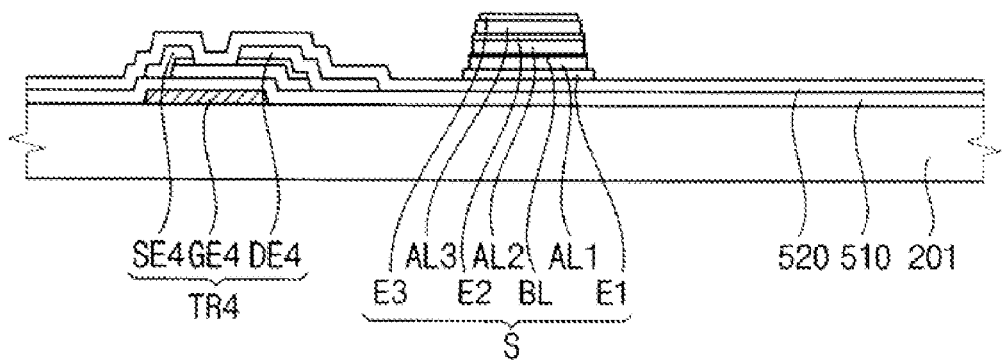

Referring to FIGS. 6, 9 and 10G, the third electrode layer E3 is formed on the second base substrate 201 on which the third photon absorption layer AL3 is formed. The third electrode layer E3 may comprise an opaque metal layer. Examples of materials for forming the third electrode layer E3 include copper (Cu), aluminum (Al), molybdenum (Mo), etc.

Figure 10H:
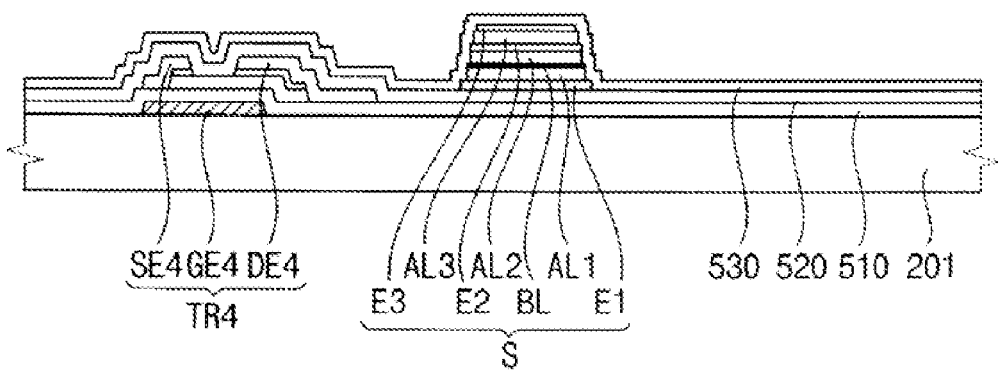

Referring to FIGS. 6, 9 and 10H, the sensor protection layer 530 is formed on the second base substrate 201 on which the third photon absorption layer AL3 is formed.

Figure 10I:
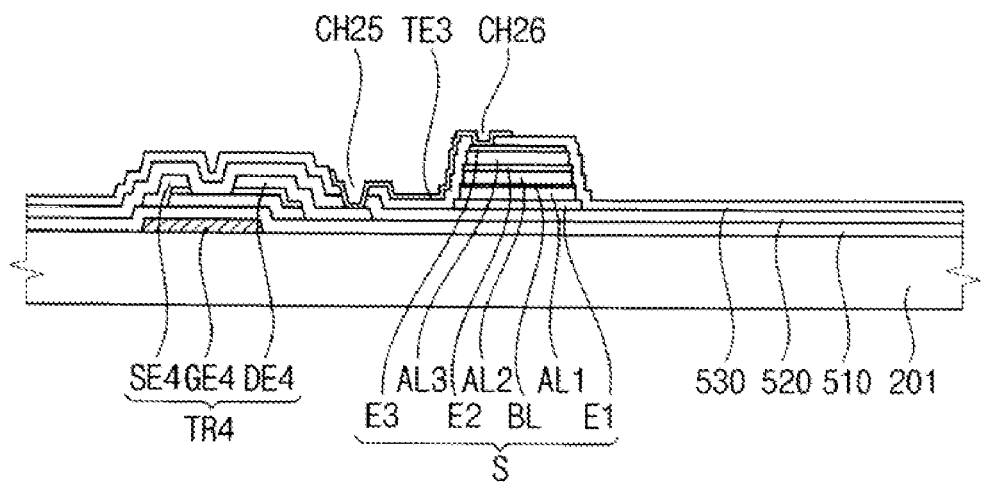

Referring to FIGS. 6, 9 and 10I, the upper inorganic insulation layer 520 on the second drain electrode DE2 and the sensor protection layer 530 are patterned to form a first contact hole (not shown). The sensor protection layer 530 formed on the image sensor S is patterned to form a second contact hole (not shown). A first transparent electrode TE1 is formed on the sensor protection layer 530 to electrically connect the first electrode layer E1 to the second drain electrode DE2.

The upper inorganic insulation layer 520 on the third drain electrode DE3 and the sensor protection layer 530 are patterned to form a third contact hole (not shown). The sensor protection layer 530 formed on the image sensor S is patterned to form a fourth contact hole (not shown). A second transparent electrode TE2 is formed on the sensor protection layer 530 to electrically connect the second electrode layer E2 to the third drain electrode DE3.

The upper inorganic insulation layer 520 on the fourth drain electrode DE4 and the sensor protection layer 530 are patterned to form a fifth contact hole CH25. The sensor protection layer 530 formed on the image sensor S is patterned to form a sixth contact hole CH26. The third transparent electrode TE3 is formed on the sensor protection layer 530 to electrically connect the third electrode layer E3 to the fourth drain electrode DE4.

Figure 10J:
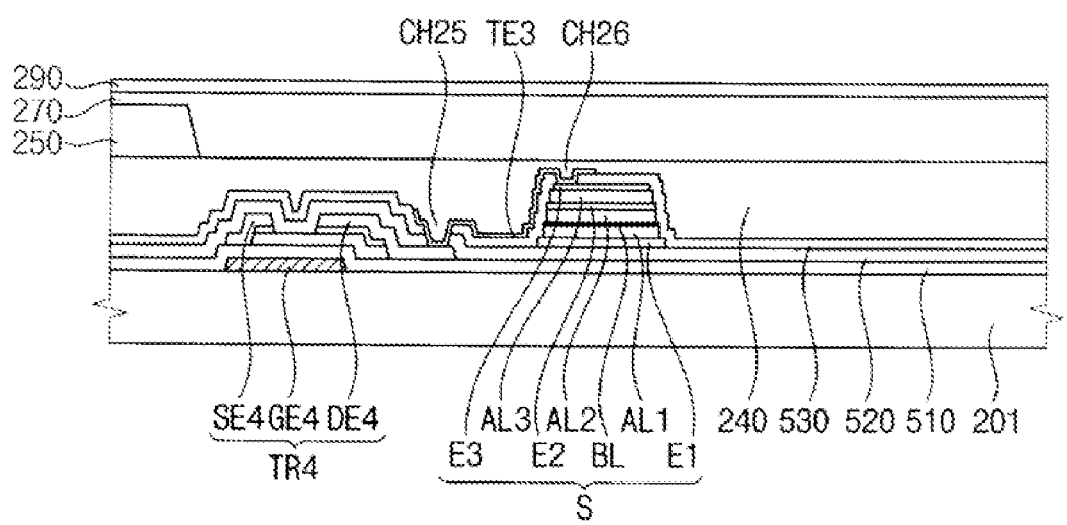

Referring to FIGS. 6, 9 and 10J, the light-blocking pattern 240, the color filter pattern 250, the overcoat layer 270 and the common electrode 290 are formed on the second base substrate 201 on which the first, second and third transparent electrodes TE1, TE2 and TE3 are formed.

According to this example embodiment of the present disclosure, the second switching element TR2, the third switching element TR3 and the fourth switching element TR4 are previously formed, and then the image sensor S is formed. Therefore, only the image sensor S is patterned to form the second contact hole (not shown), the fourth contact hole (not shown) and the sixth contact hole CH26 in the image sensor S. Thus, the process for manufacturing the image sensor S may be further simplified.

According to the above-described example embodiments of the present disclosure of invention, pre-charging voltages are applied across the photon absorption layers where the layers include nanoparticles which have different sizes in the respective photon absorption layers, and the blocking layer having a function of the tunneling barrier is formed between the photon absorption layers. Therefore, an image sensor having high quantum efficiency is integrally provided for use in the display device. Further, the image sensor may scan an image or determine a location of a touched position according to the scan mode or the sensing mode by using the light generated from the backlight unit. Therefore, the display device including the image sensor does not require a plurality of separate infrared ray generation devices and a plurality of IR detecting devices. Thus, power consumption of the display device may be reduced, and the cost of manufacturing the display device may be reduced.

The foregoing is illustrative of the present disclosure and is not to be construed as limiting thereof. Although a few example embodiments in accordance with the present teachings have been described, those skilled in the art will readily appreciate from the foregoing that many modifications are possible in the example embodiments without materially departing from the novel teachings and advantages of the present disclosure. Accordingly, all such modifications are intended to be included within the scope of the present teachings. In the claims, means-plus-function clauses are intended to cover the structures described herein as performing the recited function and not only structural equivalents but also functionally equivalent structures. Therefore, it is to be understood that the foregoing is illustrative of the present disclosure and is not to be construed as limited to the specific example embodiments disclosed, and that modifications to the disclosed example embodiments, as well as other example embodiments, are intended to be included within the scope of the present disclosure.

What is claimed is:

1. A photonic sensor comprising:
   a first electrode layer formed on a substrate, the first electrode layer being configured to receive a first voltage;
   a second electrode layer configured to receive a second voltage different from the first voltage;
   a third electrode layer configured to receive a third voltage;
   a first photon absorption layer overlapping with the first electrode layer and electrically connecting thereto so as to receive the first voltage, the first photon absorption layer including first nanoparticles dispersed therein and being structured to transduce a first color light into corresponding electrical charge;
   a second photon absorption layer overlapping with the second electrode layer and electrically connecting thereto so as to receive the second voltage, the second photon absorption layer including second nanoparticles dispersed therein and being structured to transduce a second color light into corresponding electrical charge, wherein the second nanoparticles have an average size different from an average size of the first nanoparticles;
   a third photon absorption layer overlapping with the third electrode layer and electrically connecting thereto so as to receive the third voltage, the third photon absorption layer including third nanoparticles dispersed therein and being structured to transduce a third color light into corresponding electrical charge, wherein the third nanoparticles have an average size different from respective average sizes of the first and second nanoparticles; and
   a charge blocking layer formed between the first photon absorption layer and the second photon absorption layer, the blocking layer being configured to block a flow of free charge between the first photon absorption layer and the second photon absorption layer.

2. The photonic sensor of claim 1 wherein:
   the first color light has a first wavelength;
   the second color light has a second wavelength larger than the first wavelength, and
   the third color light has a third wavelength larger than the second wavelength.

3. The photonic sensor of claim 1, wherein a band gap of the first photon absorption layer is larger than a band gap of the second photon absorption layer, and the band gap of the second photon absorption layer is larger than a band gap of the third photon absorption layer.

4. The photonic sensor of claim 1, wherein said average size of the first nanoparticles is smaller than said average size of the second nanoparticles, and the average size of the second nanoparticles is smaller than the average size of the third nanoparticles.

5. The photonic sensor of claim 1, wherein a band gap of the blocking layer is larger than band gaps of the first photon absorption layer, the second photon absorption layer and the third photon absorption layer.

6. The photonic sensor of claim 1, wherein each of the first photon absorption layer, the second photon absorption layer and the third photon absorption layer comprises a silicon nitride bulk portion.

7. The photonic sensor of claim 6, wherein each of the first nanoparticles, the second nanoparticles and the third nanoparticles is comprised of correspondingly sized silicon particles.

8. A method of manufacturing an photonic sensor, the method comprising:
 forming a first electrode layer on a substrate;
 forming a first photon absorption layer on the first electrode layer, the first photon absorption layer including a first nanoparticle and sensing a first color light;
 forming a blocking layer on the first photon absorption layer, the blocking layer blocking a flow of charge;
 forming a second photon absorption layer on the blocking layer, the second photon absorption layer including a second nanoparticle having a size different from a size of the first nanoparticle, the second photon absorption layer sensing a second color light;
 forming a second electrode layer on the second photon absorption layer;
 forming a third photon absorption layer on the second electrode layer, the third photon absorption layer including a third nanoparticle having a size different from the sizes of the first nanoparticle and the second nanoparticle, the third photon absorption layer sensing a third color light; and
 forming a third electrode layer on the third photon absorption layer.

9. The method of claim 8, wherein a size of the first nanoparticle is smaller than a size of the second nanoparticle, and the size of the second nanoparticle is smaller than a size of the third nanoparticle.

10. The method of claim 8, wherein each of the first photon absorption layer, the second photon absorption layer and the third photon absorption layer comprises silicon nitride bulk portion.

11. The method of claim 10, wherein each of the first nanoparticles, the second nanoparticles and the third nanoparticles is comprised of correspondingly sized silicon particles.

12. A color filter substrate comprising:
 a photonic sensor formed on a substrate to sense a first light, a second light and a third light, the photonic sensor comprising:
  a first electrode layer formed on the substrate, the first electrode layer receiving a first voltage;
  a second electrode layer receiving a second voltage different from the first voltage;
  a third electrode layer receiving the second voltage;
  a first photon absorption layer overlapping with the first electrode layer and receiving the first voltage, the first photon absorption layer including a first nanoparticle and sensing the first color light;
  a second photon absorption layer overlapping with the second electrode layer and receiving the second voltage, the second photon absorption layer including a second nanoparticle having a size different from a size of the first nanoparticle, the second photon absorption layer sensing the second color light;
  a third photon absorption layer overlapping with the third electrode layer and receiving the second voltage, the third photon absorption layer including a third nanoparticle having a size different from the sizes of the first nanoparticle and the second nanoparticle, the third photon absorption layer sensing the third color light; and
  a charge blocking layer formed between the first photon absorption layer and the second photon absorption layer, the blocking layer being structured to block a flow of charge between the first photon absorption layer and the second photon absorption layer; and
 a color filter pattern formed on the substrate on which the photonic sensor is formed, the color filter pattern including a plurality of color filters.

13. The color filter substrate of claim 12, further comprising:
 a first voltage line extending in a first direction, the first voltage line applying the first voltage to the first electrode layer;
 a second voltage line adjacent to the first voltage line, the second voltage line applying the second voltage to the second electrode layer and the third electrode layer;
 a first switching element electrically connected to the first voltage line and the first electrode layer;
 a second switching element electrically connected to the second voltage line and the second electrode layer;
 a third switching element electrically connected to the third voltage line and the third electrode layer;
 a first sensing gate line extending in a second direction different from the first direction, the first sensing gate line applying a first sensing gate signal to the first switching element and the second switching element; and
 a second sensing gate line adjacent to the first sensing gate line, the second sensing gate line applying a second sensing gate signal to the third switching element.

14. The color filter substrate of claim 13, further comprising:
 a first transparent electrode connecting the first electrode layer to the first switching element;
 a second transparent electrode connecting the second electrode layer to the second switching element; and
 a third transparent electrode connecting the third electrode layer to the third switching element.

15. The color filter substrate of claim 13, further comprising:
 a first capacitor formed between the first sensing gate line and the first switching element, the first capacitor being configured to be electrically charged with a first charge by photoelectrons generated by the first color light;
 a second capacitor formed between the first sensing gate line and the second switching element, the second capacitor being configured to be electrically charged with a second charge by photoelectrons generated by the second color light; and
 a third capacitor formed between the second sensing gate line and the third switching element, the third capacitor being configured to be electrically charged with a third charge by photoelectrons generated by the third color light.

16. The color filter substrate of claim 12, wherein the first electrode layer and the second electrode layer are transparent, and the third electrode layer is opaque.

17. The color filter substrate of claim 12, further comprising a light-blocking pattern covering the photonic sensor.

18. A display device comprising:
 an array substrate including a gate line and a data line crossing with the gate line;
 a color filter substrate including:
  a photonic sensor formed on a substrate to sense a first light, a second light and a third light; and
  a color filter pattern formed on the substrate on which the photonic sensor is formed, the color filter pattern including a plurality of color filters; and
 a liquid crystal layer disposed between the array substrate and the color filter substrate, the photonic sensor comprising:
- a first electrode layer formed on the substrate, the first electrode layer receiving a first voltage;
- a second electrode layer receiving a second voltage different from the first voltage;
- a third electrode layer receiving the second voltage;
- a first photon absorption layer overlapping with the first electrode layer and receiving the first voltage, the first photon absorption layer including a first nanoparticle and sensing the first color light;
- a second photon absorption layer overlapping with the second electrode layer and receiving the second voltage, the second photon absorption layer including a second nanoparticle having a size different from a size of the first nanoparticle, the second photon absorption layer sensing the second color light;
- a third photon absorption layer overlapping with the third electrode layer and receiving the second voltage, the third photon absorption layer including a third nanoparticle having a size different from the sizes of the first nanoparticle and the second nanoparticle, the third photon absorption layer sensing the third color light; and
- a blocking layer formed between the first photon absorption layer and the second photon absorption layer, the blocking layer blocking a flow of charge between the first photon absorption layer and the second photon absorption layer.

19. The display device of claim 18, wherein the data line overlaps with the first voltage line and the second voltage line, and the second sensing gate line overlaps with the gate line.

* * * * *